(12) United States Patent
Hoffman

(10) Patent No.: US 8,338,694 B2
(45) Date of Patent: Dec. 25, 2012

(54) SOLAR ENERGY COLLECTION SYSTEM

(75) Inventor: James T. Hoffman, Alameda, CA (US)

(73) Assignee: Sun Synchrony, Alameda, CA (US)

( * ) Notice: Subject to any disclaimer, the term of this patent is extended or adjusted under 35 U.S.C. 154(b) by 7 days.

(21) Appl. No.: 12/996,317

(22) PCT Filed: Jun. 8, 2009

(86) PCT No.: PCT/US2009/046606
§ 371 (c)(1),
(2), (4) Date: Jun. 21, 2011

(87) PCT Pub. No.: WO2009/149450
PCT Pub. Date: Dec. 10, 2009

(65) Prior Publication Data
US 2011/0240094 A1    Oct. 6, 2011

Related U.S. Application Data

(60) Provisional application No. 61/131,268, filed on Jun. 7, 2008, provisional application No. 61/132,550, filed on Jun. 20, 2008.

(51) Int. Cl.
*H01L 31/052* (2006.01)
*F24J 2/10* (2006.01)

(52) U.S. Cl. .......... 136/246; 362/245; 356/72; 359/850; 126/684

(58) Field of Classification Search ................... 136/246; 362/245, 520; 356/72, 317–318, 336–343; 359/850–861; 126/684
See application file for complete search history.

(56) References Cited

U.S. PATENT DOCUMENTS

| 2,512,636 | A | 6/1950 | Flynt |
| 3,923,381 | A | 12/1975 | Winston |
| 3,972,598 | A | 8/1976 | Kunz |
| 3,974,824 | A | 8/1976 | Smith |
| 3,995,933 | A | 12/1976 | Crowhurst |
| 4,002,159 | A | 1/1977 | Angilletta |
| 4,069,812 | A | 1/1978 | O'Neill |
| 4,088,120 | A | 5/1978 | Anderson |
| 4,088,121 | A | 5/1978 | Lapeyre |

(Continued)

FOREIGN PATENT DOCUMENTS
WO    WO 2008/039509 A2    4/2008

OTHER PUBLICATIONS

International Search Report mailed Sep. 29, 2009, for International Application No. PCT/US2009/046606.

(Continued)

*Primary Examiner* — Seung C Sohn
(74) *Attorney, Agent, or Firm* — Kilpatrick Townsend & Stockton LLP

(57) ABSTRACT

A method of concentrating directional radiant energy using reflective optics and receivers that convert that energy wherein the receivers are situated in the body of the reflector on risers parallel to the direction of radiant energy, each said riser bounded by at least one parabolic mirror lying closer and another lying farther from the energy source, where the focus or foci of said mirrors lie substantially in the direction faced by the receiver situated in said riser. The reflector geometries include ones in which the mirrors are parabolic cylinder sections and require only one-axis tracking to focus, and ones in which the mirrors are paraboloid sections and require two-axis tracking to focus sunlight.

20 Claims, 26 Drawing Sheets

U.S. PATENT DOCUMENTS

| | | |
|---|---|---|
| 4,092,531 A | 5/1978 | Moss |
| 4,106,484 A | 8/1978 | Dame |
| 4,107,521 A | 8/1978 | Winders |
| 4,129,119 A | 12/1978 | Yoke |
| 4,137,098 A | 1/1979 | Field |
| 4,143,640 A | 3/1979 | Pierce |
| 4,146,785 A | 3/1979 | Neale |
| 4,153,474 A | 5/1979 | Rex |
| 4,189,122 A | 2/1980 | Miller |
| 4,204,881 A | 5/1980 | McGrew |
| 4,222,368 A | 9/1980 | Rost et al. |
| 4,226,502 A | 10/1980 | Gunzler |
| 4,269,168 A | 5/1981 | Johnson |
| 4,282,529 A | 8/1981 | Speicher |
| 4,285,330 A | 8/1981 | Shook |
| 4,287,880 A | 9/1981 | Geppert |
| 4,296,737 A | 10/1981 | Silk |
| 4,304,218 A | 12/1981 | Karlsson |
| 4,320,288 A | 3/1982 | Schlarlack |
| 4,332,426 A | 6/1982 | Speicher |
| 4,349,733 A | 9/1982 | Beam et al. |
| 4,388,481 A | 6/1983 | Uroshevich |
| 4,440,155 A | 4/1984 | Maloof et al. |
| 4,489,709 A | 12/1984 | Balzer |
| 4,495,408 A | 1/1985 | Mori |
| 4,690,355 A | 9/1987 | Hornung et al. |
| 4,691,075 A | 9/1987 | Murphy |
| 4,870,949 A | 10/1989 | Butler |
| 4,968,355 A | 11/1990 | Johnson |
| 5,169,456 A | 12/1992 | Johnson |
| 5,180,441 A | 1/1993 | Cornwall et al. |
| 5,255,666 A | 10/1993 | Curchod |
| 5,344,496 A | 9/1994 | Stern et al. |
| 5,374,317 A | 12/1994 | Lamb et al. |
| 5,498,297 A | 3/1996 | O'Neill et al. |
| 6,276,359 B1 | 8/2001 | Frazier |
| 6,531,990 B2 | 3/2003 | Verkerk |
| 6,764,051 B2 | 7/2004 | Knight |
| 6,911,950 B2 | 6/2005 | Harron |
| 6,971,756 B2 | 12/2005 | Vasylyev et al. |
| 7,240,674 B2 | 7/2007 | Patterson |
| 7,825,327 B2 | 11/2010 | Johnson et al. |
| 2002/0008670 A1 * | 1/2002 | Sharman ................ 343/840 |
| 2003/0000567 A1 | 1/2003 | Lynn |
| 2003/0202349 A1 * | 10/2003 | Suehiro et al. ............ 362/245 |
| 2005/0034752 A1 | 2/2005 | Gross et al. |
| 2006/0283497 A1 | 12/2006 | Hines |
| 2007/0039610 A1 | 2/2007 | Head et al. |
| 2007/0070531 A1 | 3/2007 | Lu |
| 2007/0079864 A1 | 4/2007 | Gronet |
| 2007/0188876 A1 | 8/2007 | Hines et al. |
| 2007/0193620 A1 | 8/2007 | Hines et al. |
| 2007/0215197 A1 | 9/2007 | Buller et al. |
| 2008/0000516 A1 | 1/2008 | Shifman |
| 2008/0142078 A1 | 6/2008 | Johnson |

OTHER PUBLICATIONS

U.S. Appl. No. 12/131,065, filed Dec. 3, 2009.

* cited by examiner

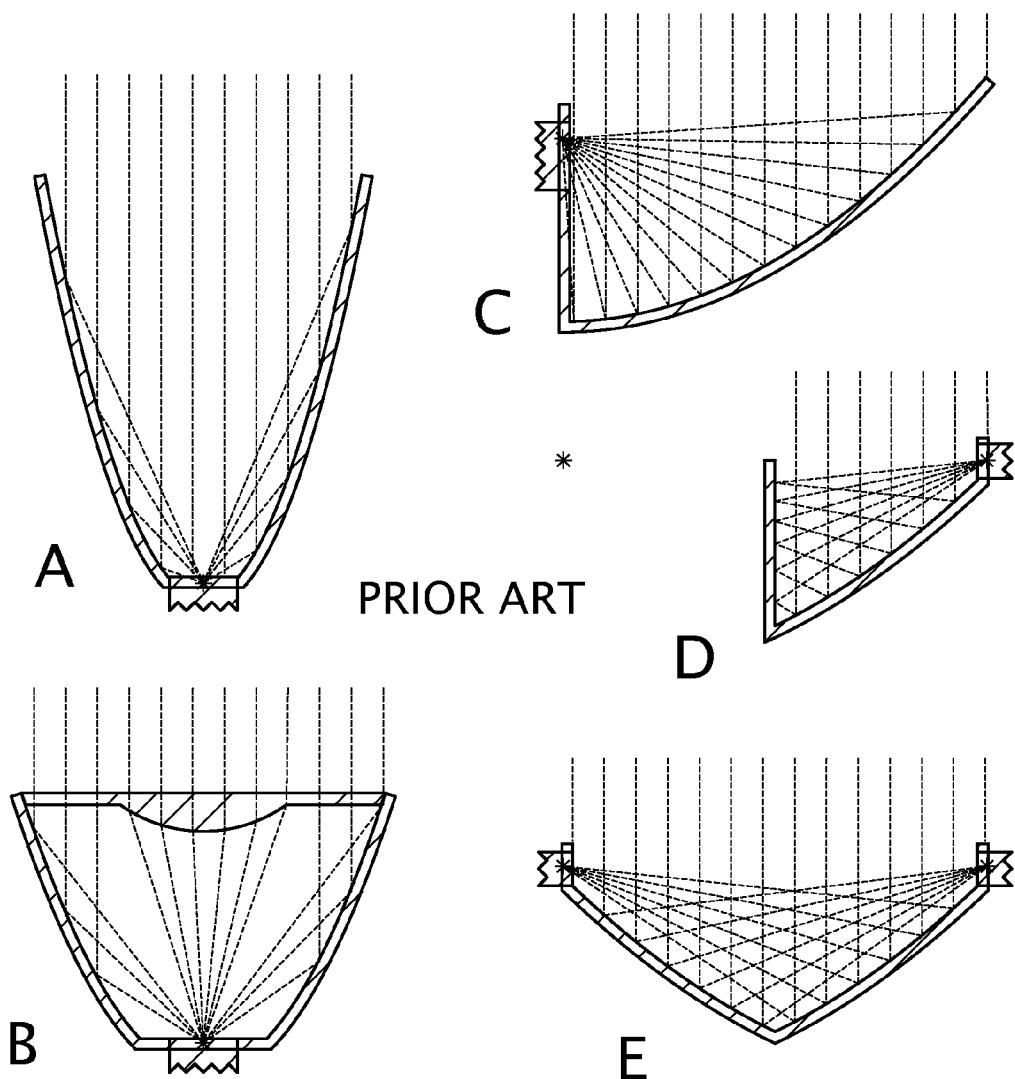
PRIOR ART
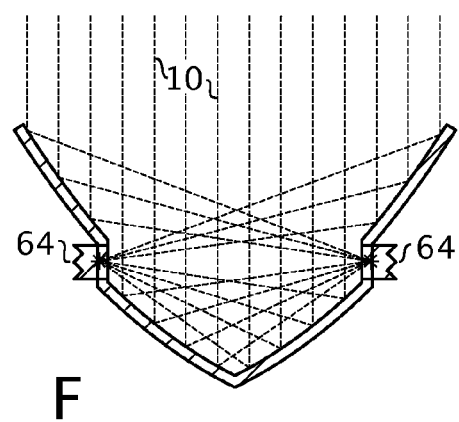
FIG. 3

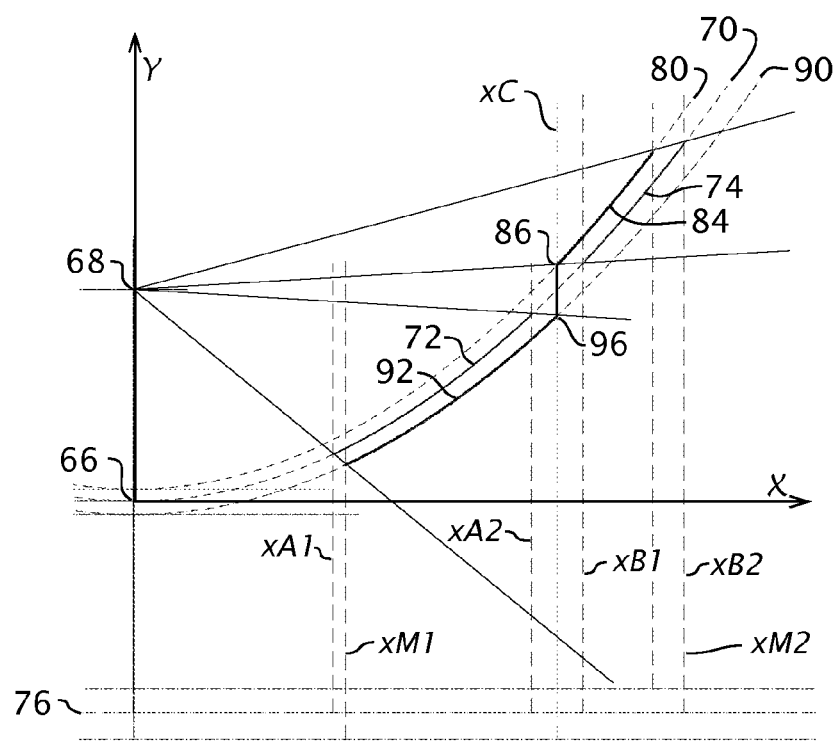
A
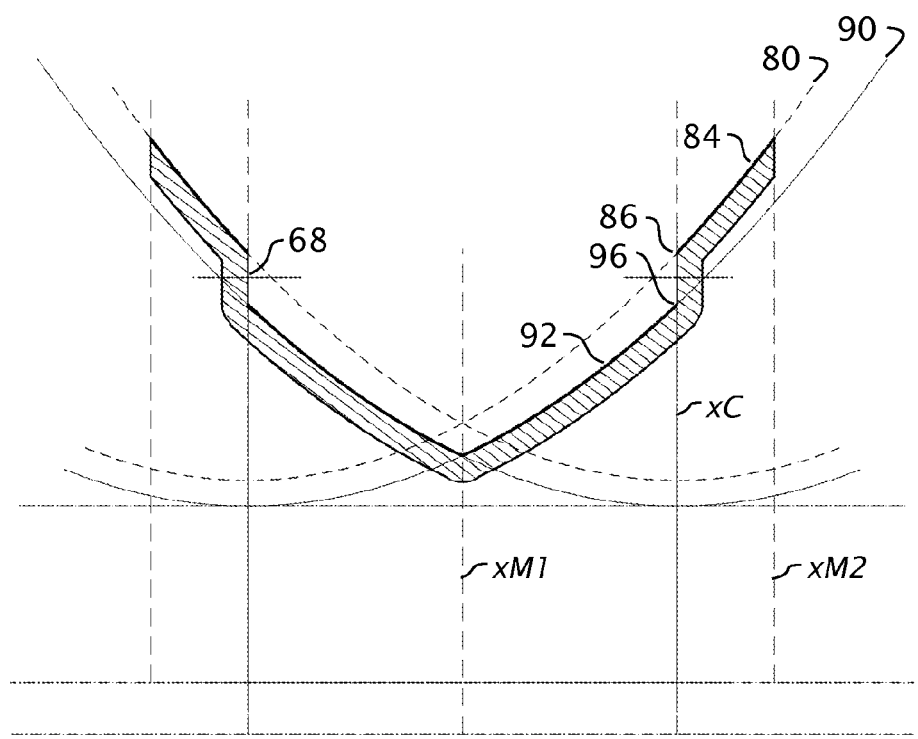
FIG. 4  B

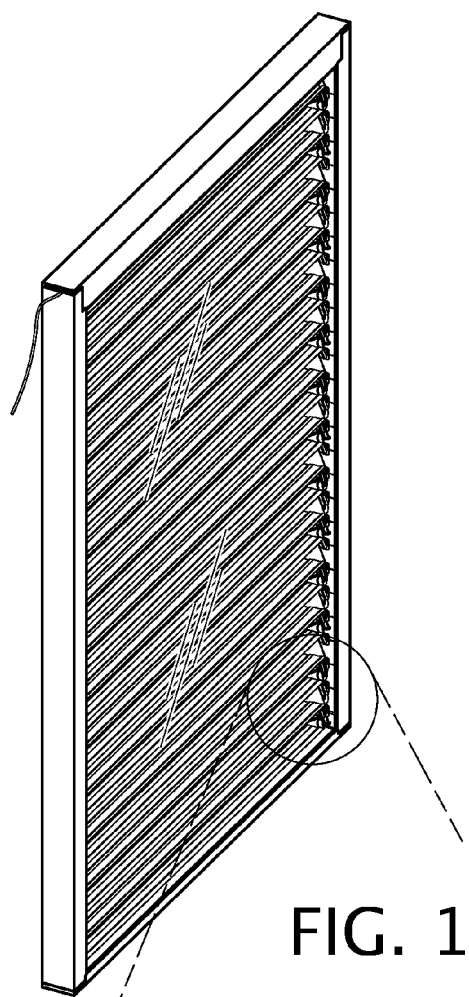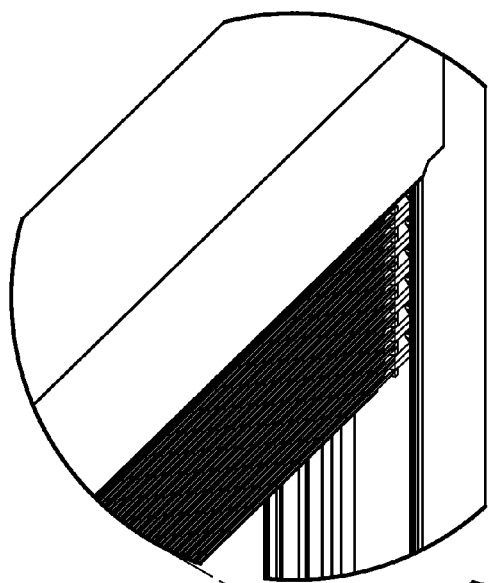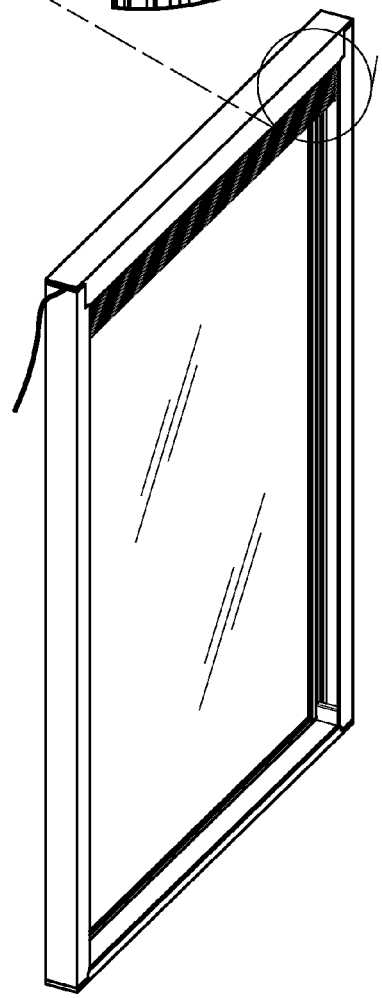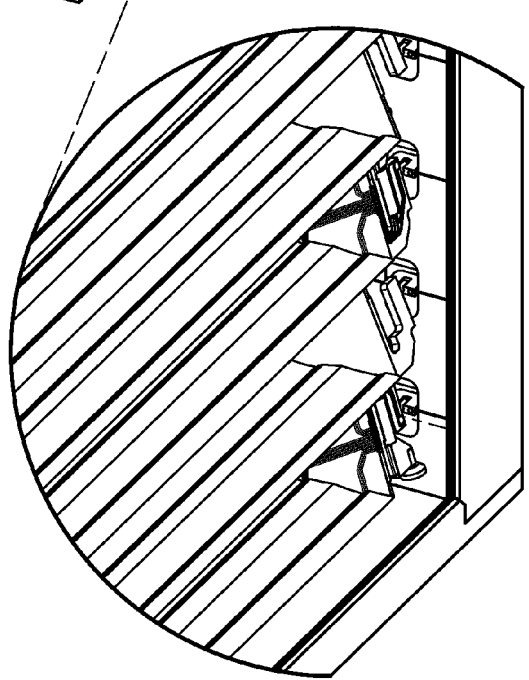
FIG. 17
FIG. 18

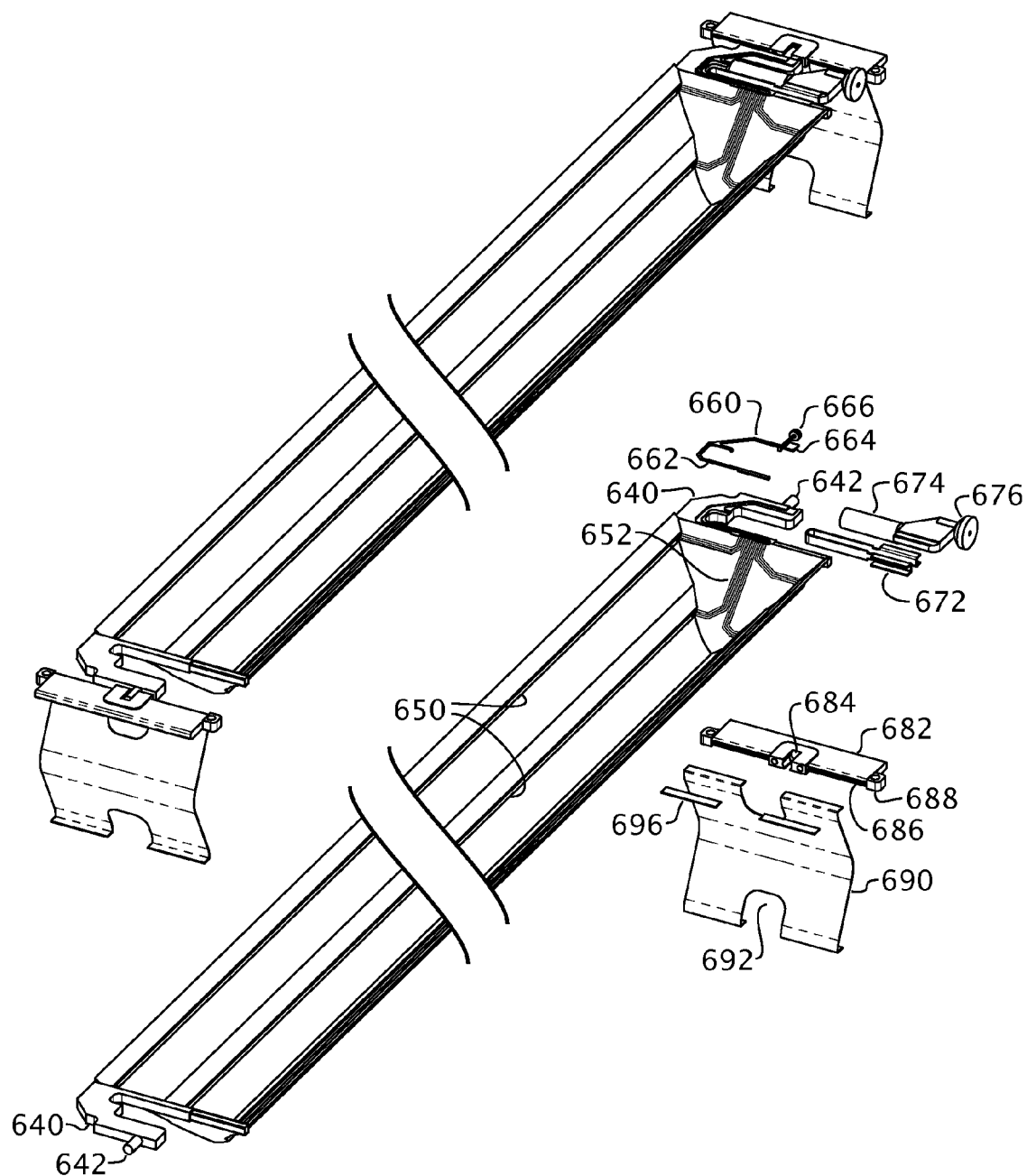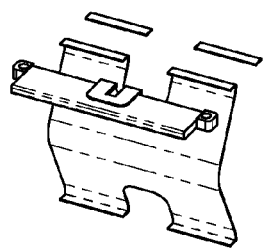
FIG. 21

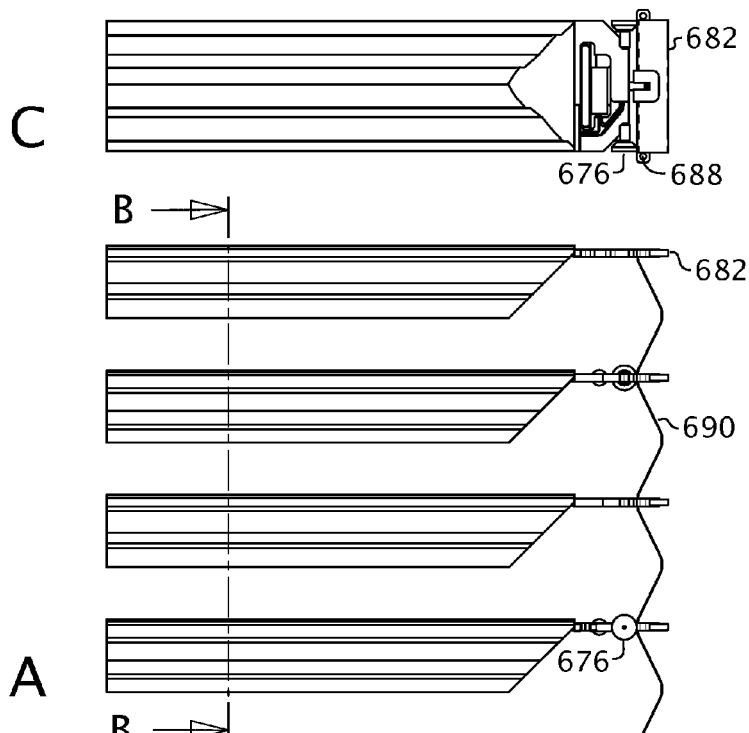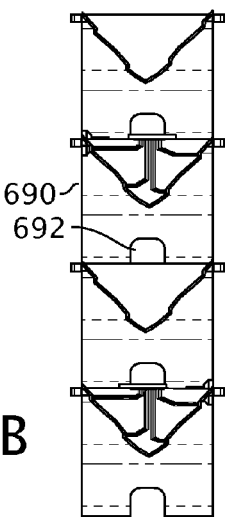
FIG. 22
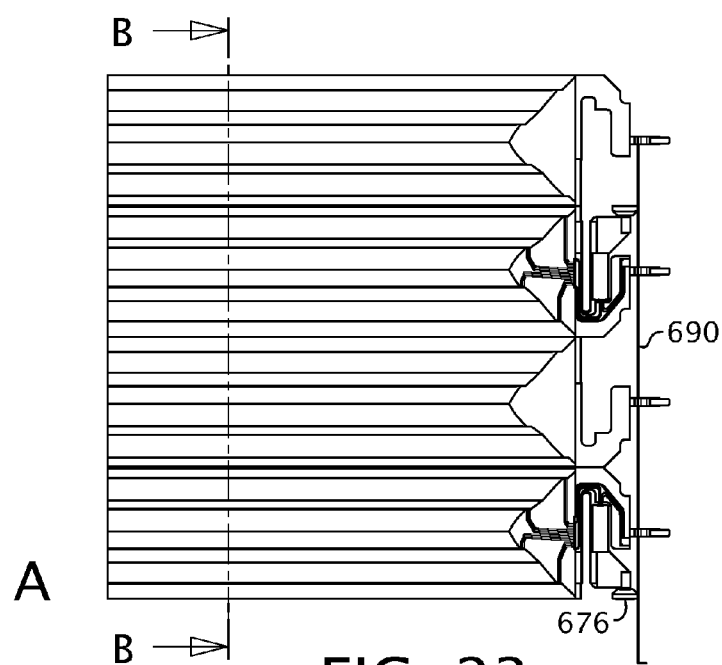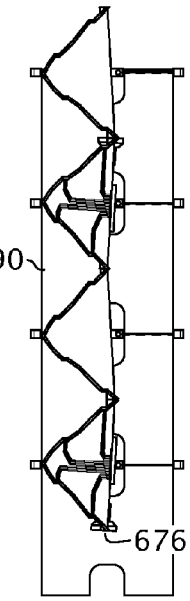
FIG. 23

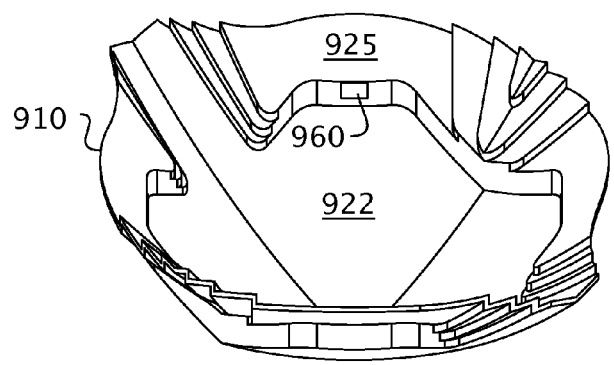
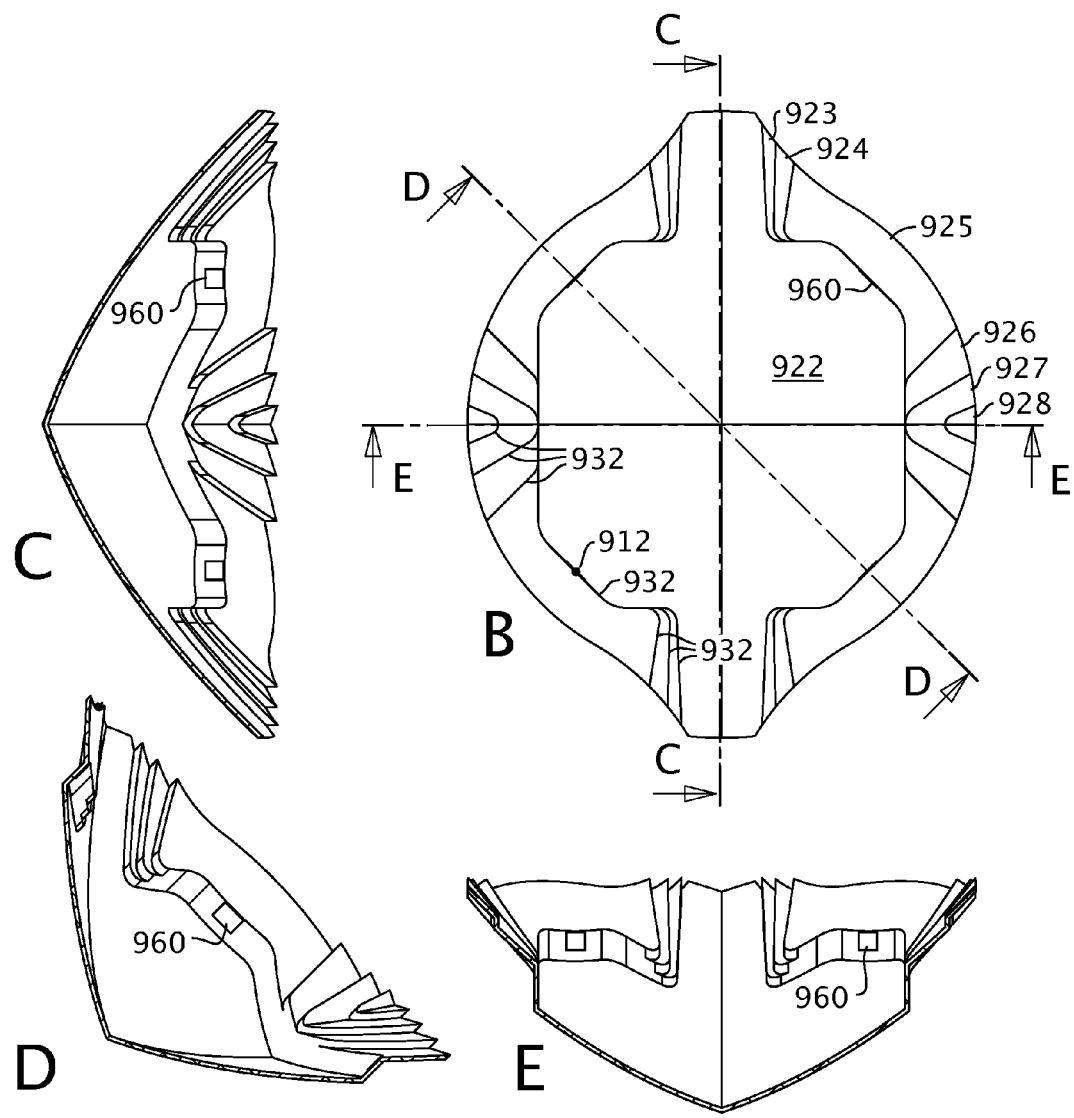
FIG. 30

SOLAR ENERGY COLLECTION SYSTEM

PRIORITY

Claim of Priority Under 35 U.S.C. §119

This application claims benefit of International Application No. PCT/US2009/046606 filed Jun. 8, 2009, which claims benefit of U.S. Provisional Patent Application No. 61/131,268, field Jun. 7, 2008, and U.S. Provisional Patent Application No. 61/132,550, filed Jun. 20, 2008, all of which are incorporated herein in their entireties.

FIELD OF THE INVENTION

The present invention relates to methods of collecting solar energy using optical concentration with moving modules that track the sun, and, in particular, such methods which are suitable for the construction of systems having form factors and installation features similar to conventional solar panels.

BACKGROUND

Whereas the optical concentration of directional light onto photovoltaic and/or thermal receivers has long been used in industrial-scale solar power installations, small-scale solar installations have consisted almost entirely of plate-type photovoltaic panels without optical concentration. Such panels are expensive because of the large quantities of photovoltaic material they use, and typically require several years of operation just to recover the energy of production of those materials. A solar panel that used optical concentration with photovoltaics (CPV) could potentially provide a much less expensive alternative to plate-type solar panels by greatly reducing the quantities of photovoltaic materials used. Furthermore, a CPV panel might provide a significantly higher efficiency than a comparable plate-type panel by allowing the economic use of special high-efficiency photovoltaic cells whose cost in a panel without concentration would be prohibitive.

If a CPV panel is to be mounted to track the sun, then its design is straightforward because the sun will remain aligned with the panel's normal axis. Given the expense and profile that tracking equipment add to solar panel installations, it would be desirable to have a CPV panel that could function in a fixed-position installation and thereby become a viable replacement for the common plate-type solar panels. The creation of such a panel presents a new set of challenges due to the movement of the sun combined with the form-factor constrains of a solar panel. An obvious approach is to fill a shallow enclosure with an array of concentrating elements, using reflective and/or refractive optics, where each element pivots about its own axis or axes to track the sun. Two key performance metrics of such an approach are the fraction of light falling on the panel's face that is captured (its aperture efficiency), and the range of tracking motion of the elements. Obviously a panel that captured 100 percent of the light falling on it and tracked the sun to incidence angles of up to 90 degrees would be the most desirable, but there are numerous issues in existing and proposed designs that impact such performance attributes, and many of these issues arise from constraints imposed by the optical geometry of the CPV elements. The present invention provides a novel reflective optical geometry that solves problems in the design of efficient CPV panels.

CPV systems can be characterized by their concentration ratio, expressed as the number of suns falling on their receivers. Systems with concentration ratios greater than about three generally require the use of moving optical focusing elements that track the movement of the sun across the sky. Such optical tracking systems fall into two main types: systems in which elongate elements with uniform cross-sectional profiles individually tilt about their long axis to track the sun and keep its light focused onto narrow bands, and systems in which elements with radial symmetry individually or as clusters pivot about two axes to track the sun and keep its light focused onto small spots. The size of the disk of the sun, appearing about one-half degree in diameter, limits the theoretical concentration ratio achievable with one-axis and two-axis systems to a few hundred and a few tens of thousands respectively, with practical limits being considerably less due to imperfections in optics and tracking.

The terms one-axis and two-axis are used to denote these two approaches, referring to the number of tilt axes required to keep the sunlight focused. The present invention is applicable to both approaches, and exemplary embodiments falling under both approaches are disclosed herein.

The invention is suitable for systems using photovoltaic, thermal, and hybrid receivers over a variety of scales and a range of concentration ratios. However, because the invention allows the creation of systems having attributes of system efficiency, heat dissipation, and compactness that are particularly suited to the application area of CPV panels, comparisons with prior art made herein focus on attributes relevant to the performance of close-packed arrays of CPV elements.

This review focuses on prior art in that application area of CPV panels. In particular, it examines one- and two-axis tracking systems that employ multiple CPV elements, using primarily reflective optics, each mounted to tilt about its individual axis or axes, and each incorporating an optical focusing means and photovoltaic receiver. An example is described and its drawbacks characterized for each of three such types of such systems: ones in which elements are slats with asymmetric profiles, ones in which the elements are troughs with symmetric profiles, and ones in which the elements are dishes.

U.S. patent application Ser. No. 12/156,189 describes an array of pivotably-mounted slats, each mounting a photovoltaic strip straddling the focal line of a parabolic cylinder mirror on the facing side of the same slat.

Since the focal line of a parabolic mirror is separated from points on the mirror's surface by a distance of at least the parabolic cylinder's focal length, the slat must contain a riser extending above the cylinder's surface to support the strip of photovoltaic material. If the mirror portion of the slat is to be used as a heat sink to wick heat from the photovoltaic strip, then the riser must conduct heat to the mirror as well as provide the structural function of rigidly mounting the strip relative to the mirror, imposing a cost in materials and space requirements.

The same invention also has a limitation in the range of angles through which the slats can rotate, and hence the range of angles of directional incident light projected into a plane perpendicular to the slats' axes through which the system can capture that light and operate, that range being from near 90 degrees clockwise of the normal direction to only between about 10 to 30 degrees counterclockwise of it for most practical variants. This limitation in the system's coverage of directions of incident light constrains the choices for its optimal siting, possibly sacrificing coverage for parts of the diurnal and annual cycles.

U.S. patent application Ser. No. 11/654,256 describes a panel having a series of elongate modules mounted within a frame to pivot about their individual axes. Each module has a strip of photovoltaic cells located along its bottom, symmetrically disposed reflectors forming its sides, and a transparent cover with a central lens forming its top, such that parallel light entering a properly tilted module will either pass through the non-lens portion of the cover and be reflected from the side wall to the photovoltaic strip, or pass through the lens portion of the cover and be refracted to the photovoltaic strip.

Because of the geometric constraints imposed by this optical system, the modules' height-to-width ratio is greater than one, and the bottom of the trough is displaced from the midline of the module's aperture-defining transparent cover by a distance of about three times that of either edge of the cover. As a consequence, for the modules to have any appreciable range of motion, they must be spaced such that a portion of directional light perpendicular to the panel falls between modules, decreasing the panel's effective aperture. Increasing the modules' range of motion increases the required spacing interval, further increasing aperture losses. To accommodate a range of motion of 70 degrees to either side of the panel's perpendicular direction entails an aperture loss of up to about 50 percent.

U.S. patent application Ser. No. 11/454,441 describes a panel in which each of an array of CPV elements is pivotably mounted in a base structure and articulated to a moving bracket that forces the elements to move in unison about two axes to track the sun. The body of each CPV element is formed primarily from two halves, each half comprising a paraboloid reflector portion and flat, vertical portions, where the reflector faces of the two halves belong to the same paraboloid, whose focus is situated between the halves' vertical portions.

Details of the mechanical linkages that articulate the elements to the moving bracket and frame are not well specified, nor is the range of angular motion of the elements given the linkage. It appears that a space between each element's said halves enables a significant range of motion along one axis, but at the expense of a substantial loss of aperture. The design uses the vertical portions of the CPV element's halves both to support its photovoltaic cell, and provide surfaces for heat dissipation. Although thin in profile, these features in the "optical volume" of the element further reduce its aperture. Still more loss of aperture results from the fact that light reflected from portions of the reflector near the bases of the vertical portions is blocked from reaching the cell by that portion.

Apart from these issues, the design suffers from a trade-off between the receiver incidence angles and the CPV elements' tracking range that is shared by other designs that mount a receiver in the space above a paraboloid dish. In order for the CPV element to have a wide range of angular motion, the structure supporting the receiver must be relatively short so as not to collide with adjacent elements, resulting in a high average incidence angle of reflected light on the receiver. Because the efficiency of light capture by most photovoltaic cells begins to fall off for incidence angles of more than about 45 degrees, the fact that a significant fraction of the light captured by CPV elements of said type reaches the receiver at incidence angles in the vicinity of 45 degrees represents a potentially significant detriment to the system's efficiency.

Most two-axis CPV panel designs employ refractive instead of reflective optics. Refractive optics used for solar concentration, however, has a number of disadvantageous characteristics, including the spreading of focal spots due to chromatic aberration, the susceptibility of optical plastics to UV degradation and the weight of optical glasses, and, as with paraboloid dishes, high average incidence angles on receivers for designs in which the modules are sufficiently compact to have a wide range of angular motion.

OVERVIEW OF THE INVENTION

The present invention provides numerous solutions helpful singly or in combination to overcome problems inherent in prior art single-axis and multiple-axis solar concentrators and arrays thereof, including the following. First, the invention allows densely-packed arrays of elements to individually track through the entire range of angles up to 90 degrees away from the normal direction of the array about each axis on which the elements are mounted to tilt. Second, the invention allows capture of virtually all the sunlight falling on the panel's face through this entire angular range, eliminating the coverage gaps of many prior-art designs. Third, the invention provides superior economy of materials by combining the functions of heat sinkage, structural support, and light reflection in a single part, by positioning energy receivers between adjacent mirror sections.

Like prior art arrangements described above, applications of the invention to solar energy concentration use arrays of CPV elements each having a reflector, an energy capture device such as a photovoltaic cell, and an integral heat sink. Unlike the prior art arrangements, CPV elements of the invention embed PV cells within spans of the reflector body that face, at roughly right angles, other such spans. In the simplest case, a first cell is positioned between mirrors whose foci lie on a second cell, which is positioned between mirrors whose foci lie on the first cell. CPV elements based on the invention can have a compact shape that fits within a half-cylinder or a half-sphere whose diameter equals that of the element's aperture, and yet provide a low average angle of incidence of light on the PV cells.

In the two embodiments described in the most detail herein, the elements are elongate slats that act as heat sinks for the PV devices, are each pivotably mounted to tilt about their respective axes, and are equipped with means to sense the position of the sun and adjust their tilt angles, singly or in unison, so as to maintain the focus of incident light along the parabolic surfaces' foci and thus convergent upon the energy capture devices.

Although most of the embodiments described herein are designed for the application of concentrating solar energy, the invention has obvious applications in other fields. For example, forms of the invention using paraboloid mirrors may be used in imaging applications, where the receivers situated at the paraboloids' foci are imaging devices instead of energy conversion devices.

BRIEF DESCRIPTION OF THE DRAWINGS

The present invention is illustrated by way of example, and not by way of limitation, in the accompanying drawings in which like reference numerals refer to similar elements.

FIG. 1 shows six different examples of the invention. FIGS. 1A and B show reflectors requiring one-axis tracking, and FIGS. 1C through F show reflectors requiring two-axis tracking to focus sunlight on their receivers.

FIGS. 2 through 5: Method Overview

FIG. 2 shows a cross-section of a single slat and portions of its neighbors, where the slats are oriented so as to absorb directional incident sunlight.

FIG. 3 shows cross-sections of six one-axis concentrating designs, comparing the optical geometries of five representative examples of prior art with a that of the simplest form of invention.

FIG. 4 illustrates a method of deriving the profile of a reflector. FIG. 4A shows the derivation of the parabolic profiles of one half of a reflector, and FIG. 4B shows a complete reflector profile.

FIG. 5 shows cross-sections of six different reflectors, illustrating the effect of the two principal parameters used in the shape derivation described with reference to FIG. 4.

FIG. 6 shows views of the front exterior of a concentrating solar panel embodiment suitable for installation on rooftops.

FIG. 7 shows details of an assembled and an exploded slat, and a cross-section of the slat.

FIG. 8 shows the panel in a state of partial dis-assembly.

FIG. 9 shows a view the underside of the panel in which a portion of the back wall has been cut away to reveal the drive mechanism.

FIG. 10 shows a view of the underside of the panel in which a portion of the back wall has been cut away to reveal electrical cabling FIG. 11 shows an exploded view of a panel, in which all of the major components of the enclosure are separated.

FIG. 12 shows details of a slat's photovoltaic strips.

FIG. 13 shows an electrical schematic of the panel.

FIG. 14 shows an assembled and an exploded slat, and a cross-section of the slat.

FIG. 15 shows the profile of a slat having a single receiver strip and a secondary mirror opposite that strip.

FIG. 16 shows the profile of a slat with an asymmetric arrangement of six parabolic cylinders and four risers.

FIGS. 17 through 26: Window with Retracting Photovoltaic Concentrator

FIG. 17 shows views of the multi-function window embodiment in its energy collecting mode, with its internal photovoltaic concentrator deployed and tracking.

FIG. 18 shows views of the embodiment in its transparent window mode, with its concentrator retracted.

FIG. 19 shows a cross-section of a slat, illustrating its optical geometry.

FIG. 20 shows cross-sections of a pair of adjacent slats in an array in each of the embodiment's three operating modes.

FIG. 21 shows assembled and exploded views of a slat and its hangers.

FIG. 22 shows an assembly of four adjacent slats and their hangers, where the slats are in the stacking orientation and the hanger straps are relaxed.

FIG. 23 shows the assembly shown in FIG. 21, where the slats are in their shuttering orientation with the hanger straps fully extended.

FIG. 24 shows a cross-section of the embodiment in the retracted position.

FIG. 25 shows a cross-section of the embodiment in the deployed position, with the optical axes of the slats oriented 30 degrees above the window's normal axis.

FIG. 26 shows the retracting concentrator system revealed by hiding the window's exterior frame and glazing.

FIG. 27 shows an example of a two-axis embodiment of the invention in which the reflector has six-fold rotational symmetry and a circular profile.

FIG. 28 shows three variants of a reflector, showing the effect of varying the parameter controlling the positioning of the riser in the reflector.

FIGS. 29 and 30: Embodiment for Close-Packed Arrays

FIG. 29 shows an embodiment of the invention in which the reflector is part of a module providing two-axis pivoting and designed to be packed closely with other such modules in an array.

FIG. 30 shows several views and cross-sections of the reflector.

FIG. 31 shows an embodiment of the invention in which the reflector is the union of a tiling of identical cells having square apertures.

FIG. 32 shows an embodiment of the invention in which the reflector is the union of a tiling of identical cells having hexagonal apertures.

FIG. 33 shows a reflector of an embodiment of the invention in which the risers in which receivers are located are flanked by paraboloid mirrors instead of risers.

DETAILED DESCRIPTION OF THE INVENTION

The invention is a novel method of capturing and focusing light whose applications including the concentration of solar energy for conversion into usable forms of energy such as electricity and/or heated fluids. The invention combines multiple parabolic mirrored surfaces and at least one receiver, such as an energy-conversion or imaging device, situated along focal lines, arcs, or points of said reflective surfaces, in a rigid element mounted to tilt on one or more axes so as to maintain it in an orientation relative to directional incident light such that said light remains focused on said receiver(s).

Seen from the direction of incident light focused by an element, the element presents a set of contiguous faces while hiding the receivers from direct view in risers situated between said faces and oriented parallel to the direction of view. Each receiver straddles the focal line, arc, or point of one or more of the parabolic mirrors on the opposite side of the element, and the focal line, arc, or point of each parabolic face is straddled by a receiver.

The cross-section of a reflector roughly approximates a 'V' making an angle of 90 degrees. Stated differently, a typical reflector of the invention can be partitioned into one or more pairs of opposite sections symmetrically disposed around the reflector's axis of symmetry, where the average surface normal of a section is roughly perpendicular to that of its opposite section. The invention allows the creation of reflectors whose cross-sections can be circumscribed by a half disk having a diameter equaling the reflector's aperture.

Because of their compact geometry, multiple elements can be mounted adjacent to each other in an array to cover an area such that essentially all of the directional light falling in the aperture of that area will fall on reflective surfaces and be concentrated onto the receivers modulo some losses around the edges of the aperture that increase as the direction of incident light becomes more oblique. The efficiency with which such an array captures directional light, combined with the shallow form-factors made possible by the shapes of the elements, makes the invention ideally suited for concentrating solar panels using a small fraction of the photosensitive materials required by conventional solar panels.

The reflectors in applications of the invention to solar energy collection include both forms that require only one axis of angular movement to maintain the focus of incident light upon the receivers as the sun moves, and forms that require two such axes. The following description and the accompanying figures starts with a brief overview of representative types of embodiments of both types, then examines methods of generating reflector profiles of the invention's simplest form, then discloses several one-axis embodiments of the invention in the form of complete solar concentrating systems, and finally examines two-axis methods and embodiments of the invention.

Figure 1:
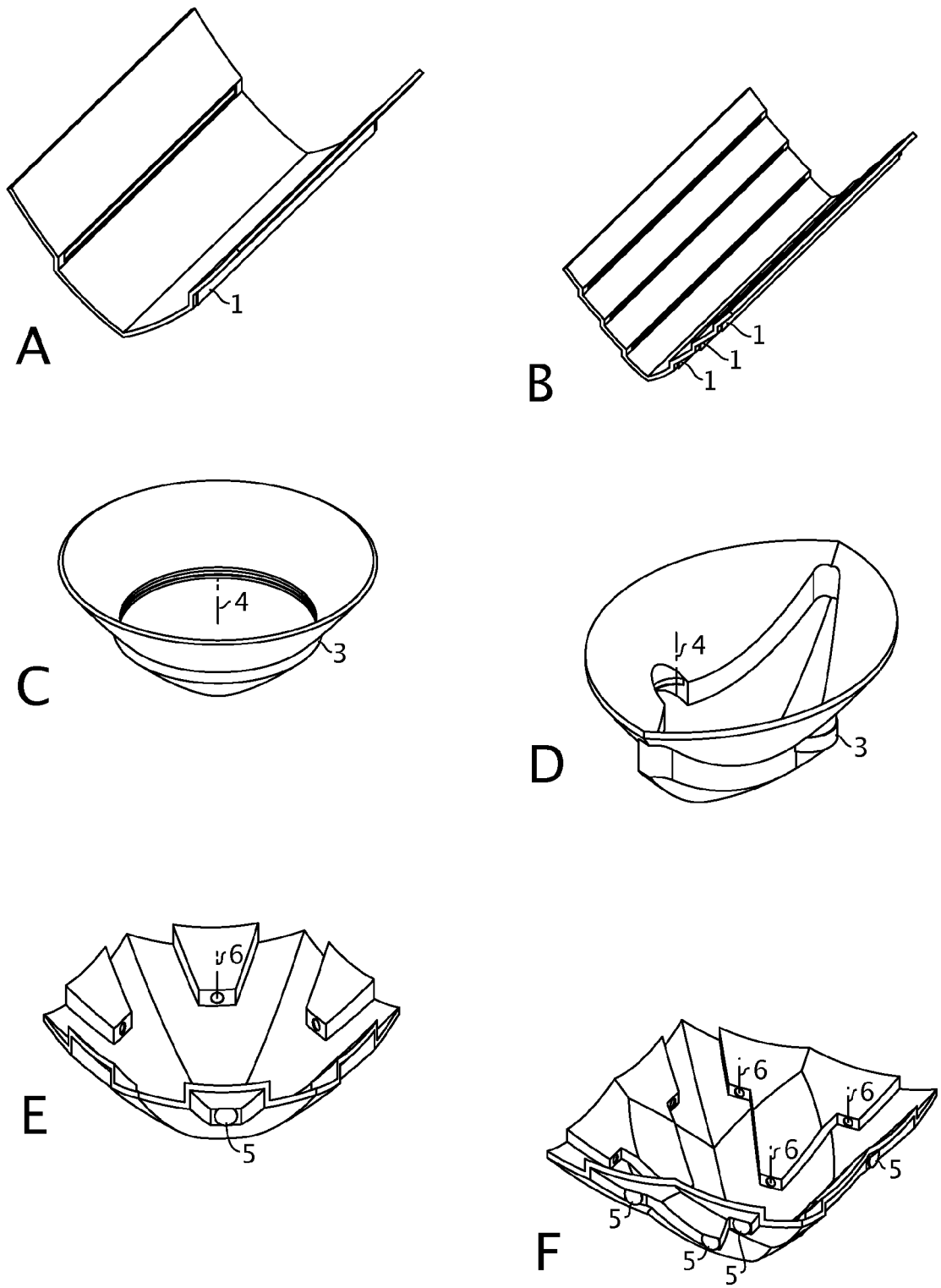
FIG. 1: Examples

FIG. 1 shows the reflectors of six embodiments of the invention, labeled A through E. For clarity, only selected axes of revolution and the portions of receivers visible on the reflectors' undersides are labeled. The receivers are of three types: strip-like and linear 1, strip-like and arcuate 3, and spot-like 5. The axes of revolution define mirror faces swept out by parabolas and are of two types: those offset from their respective parabolas' axes 4, and those coinciding with their respective parabolas' axes 6.

The six exemplary reflectors have different characteristics. Reflectors A and B are suitable for one-axis tracking, where A embodies the simplest form of the invention, having four mirrors and two receivers symmetrically disposed, and B is a variation which multiplies the number of receivers and intervening mirrors. Reflectors C through F require two-axis tracking to keep sunlight in focus. The set of six exhibits three types of concentration geometries using three types of parabolic mirrors, each of which focuses directional light differently. Reflectors A and B use parabolic cylinder mirrors to focus light onto linear bands and require elongate receivers running the length of the reflector. Reflectors C and D use paraboloid-like mirrors to focus light onto arcuate bands and require curved elongate receivers of some length. Reflectors E and F use paraboloid mirrors to focus light onto spots and require only very small receivers. Unlike the simple paraboloids of revolution used by reflectors E and F, reflectors C and D use types of paraboloids in which the axis of revolution is offset from the focus of the generating parabola.

The different types of reflectors shown in FIG. 1 each provide different advantages. Reflectors like types A and B, are attractive candidates for CPV panels because of their geometric simplicity, and need for only one-axis tracking, and potential ease of manufacturing. Reflectors like types E and F are attractive because their provision of very high concentration ratios reduces the required photovoltaic materials to a point that enables the economic use of the most efficient photovoltaic cells available. Reflectors like types C and D are attractive because the light they direct to any point on a receiver is essentially co-planar and therefore has a lower average angle of incidence than that provided by reflectors having parabolic cylinder or simple paraboloid mirrors.

The following five sections describe in detail two complete embodiments using one-axis reflectors. The first embodiment, a rooftop photovoltaic panel, is based on the simplest of a family of forms contemplated by the invention, in which the two facing sides of a slat's upper face are symmetric and are each made up of two parabolic cylinders joined by a planar strip. The second embodiment, a multi-modal photovoltaic window, uses a more complex form in which the slat's facing sides are not symmetric, and are each made up of four parabolic cylinders and two planar strips.

In addition to the two complete embodiments, portions of other embodiments are presented to illustrate additional features, some of which can be used interchangeably in a variety of arrangements constituting complete devices.

Method Overview: FIGS. 2 through 5

This section describes the geometric construction of the simplest form of the invention defined above, its relationship to prior art, and methods of determining the optimal form of the invention based on performance criteria such as aperture efficiency and tracking range-of-motion. The embodiment shown in FIGS. 6 through 13, is based on these methods.

Figure 2:
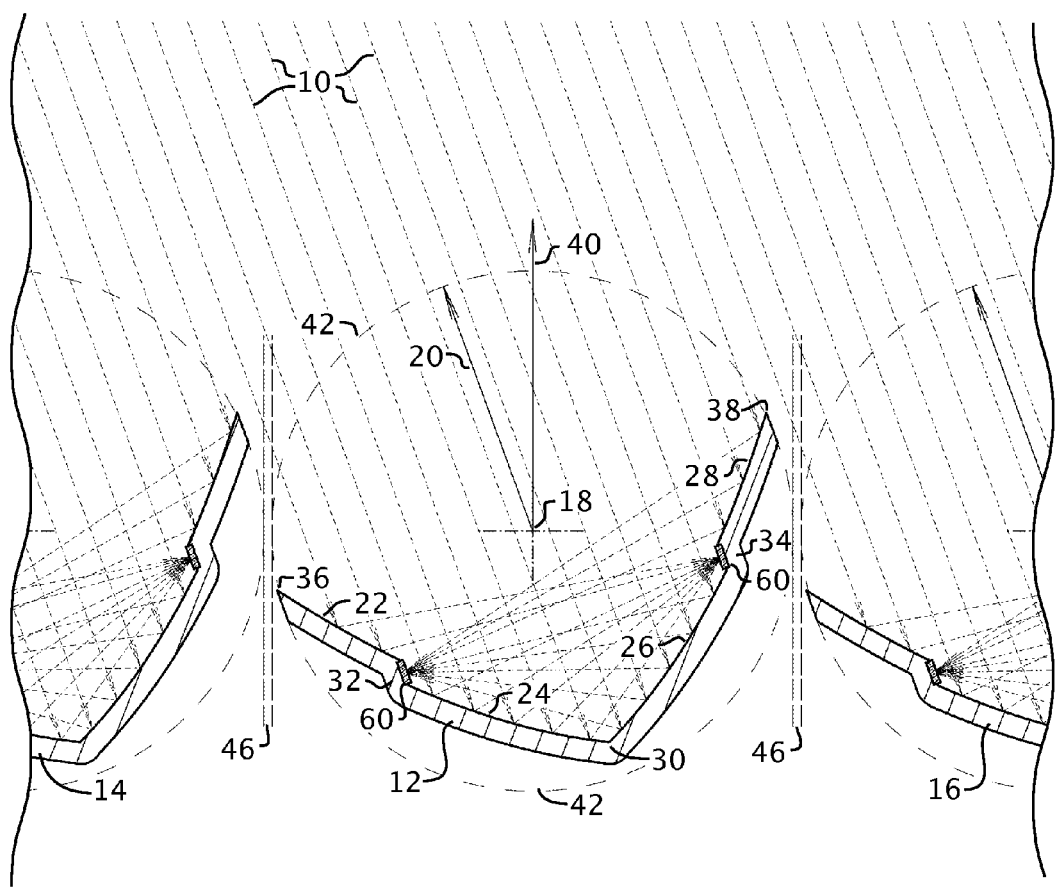

FIG. 2 shows cross-sections of a slat 12 and portions of its adjacent neighbors 14 and 16 in an array of slats rotated about their respective pivot axes 18 20 degrees away from the array's normal direction 40 to match the declination of incident light, which is indicated by the parallel dotted lines 10. Each slat has the four parabolic cylinder mirrors, 22, 24, 26, and 28 and the risers 32 and 34 whose planar faces are equipped with the photovoltaic strips 60, where the mirrors 22 and 24 are shaped to reflect directional light onto the strip on the riser 34 and the mirrors 26 and 28 are shaped to reflect directional light onto the strip on the riser 32.

The dashed circular arc 42 indicates the path swept out by the slat's edges 36 and 38 as the slat pivots about its axis 18, and represents the clearance profile of the slat. The dashed pairs of lines 46 indicate the spacing between the clearance profiles of adjacent slats.

The slats whose cross-sections are pictured in FIG. 2 lie completely within their said clearance profiles. When the slats in an array are oriented so as to capture light whose direction projected onto the plane of the slats' cross-section is perpendicular to the array's horizontal axis, the slats' edges nearly touch, allowing them to capture nearly all of the light. When the same slats are oriented so as to capture light whose direction projected onto the plane of the slats' cross-section is rotated from said perpendicular direction by an angle whose magnitude is between a few degrees more than zero and a few degrees less than 90, the slats will partially shade each other, but will continue to capture essentially all of the light entering the array's aperture, with the exception of some of the light falling on the extreme edges of the array.

The slats whose cross-sections are pictured in FIG. 2 can rotate to fully 90 degrees to either side of the array's normal direction, and can do so regardless of the angular positions of their neighboring slats. Because the invention allows the design of slat arrays with optimal (dense) spacing in which even unsynchronized slats do not collide over the entire range of rotation required by practical applications, it makes feasible the design the slats as mechanically independent modules having their own tilt drive mechanisms. In a panel having such a modular design, the malfunction of one slat would not significantly impact the operation of the remaining slats in the panel, and would only marginally affect the panel's power output.

FIG. 3 shows cross-sections and representative light paths of six methods of optical concentration using one-axis reflectors, for the purpose of reviewing prior art. FIGS. 3A through E illustrate the optical geometries of five representative examples of prior art and FIG. 3F illustrates that of the simplest form of the invention. This review is restricted to examples of primarily reflective optics that, like the invention, locate receivers 64 on surfaces that are adjacent to mirrored surfaces.

FIGs. A through E summarize the optical geometries of concentrators disclosed in (A) U.S. Pat. No. 4,088,121, (B) U.S. patent application Ser. Nos. 11/654,131 and 11/654,256, (C) U.S. Pat. No. 4,222,368 and U.S. patent application Ser. No. 12/156,189, (D) U.S. Pat. No. 6,276,359, and (E) U.S. patent application Ser. No. 12/124,124. Examples A and B reflect light downward from symmetrically disposed mirrors to receivers located at the bottoms of trough-like structures, where example B refracts the central column of light to achieve a more compact unit; example C reflects light from a mirror to a facing receiver near the top of a slat-like structure; and examples D and E reflect light upward from mirrors to facing receivers located at the top edges of the mirrors in trough-like structures. In contrast to all of these, example C reflects light downward and upward from mirrors to facing receivers that are situated between mirrors.

Several advantages of the invention over these examples of prior art become evident when considering their suitability for the application of CPV panels, which calls for the elements to be individually pivotably mounted within an array of closely packed elements. As can be seen with reference to FIGS. 2 and 4, the simplest form of the invention excels in the two performance attributes of aperture efficiency and range of angular motion by providing reflectors that, within such an array, can be moved through large ranges of angular motion while providing continuous coverage of the array's aperture. This is because the invention enables the creation of reflectors each having an aperture whose width matches the diameter of a circle circumscribing the reflector's cross-section. None of the prior art examples have this property. Examples A and B impose a trade-off between range of angular motion and aperture efficiency because of the reflector depth, which is less severe in example B. Example C suffers from a significantly restricted range of angular motion for all embodiments that provide continuous aperture coverage. Examples D and E impose a significant penalty in aperture efficiency because of the additional clearance requirements of the receivers mounted at outside top edges of the reflectors. In contrast to these designs, the exemplary embodiment has a shallow V-shaped trough that captures virtually all of the light falling on it, In contrast to these, the concentrator design depicted in FIG. 3E has a V-shaped profile that is nearly twice as wide as it is tall so it can pivot over a wide angular range within close-packed arrays of such concentrators, positions the receivers where they don't create clearance demands, and reflects light to the receivers with low and balanced angles of incidence.

FIG. 4 illustrates a method for deriving the profiles of reflectors such as are shown in FIGS. 2 through 16. Although this method is illustrated for the simplest form of the invention as exemplified in FIGS. 2 through 16, persons skilled in the art will be able to develop generalizations of it suitable for variations contemplated by the invention. The method has three input parameters: xC, which is equal to or close to 0.5, xD, which is a typically between 0.01 and 0.03, and xE, which is typically between 0.08 and 0.4. The method starts by defining a parabola 70 as the set of points equidistant from the focus 68 and the directorix 76. The parabola, whose vertex is at the origin 66, is also the solution to the equation $y=x^2$, given the coordinate system scaled such that the focus 68 is displaced from the origin along the Y axis by 0.25 units. Next, the x coordinates xA1, xA2, xB1, and xB2, indicated in the drawing by dashed vertical lines, are computed from said input parameters, as follows: xA2=xC−xD; xB1=xC+xD; xB2=xB1+xE; xA1=xA2*0.5; xM1=xC/2; and xM2=xB2*xC/xB1. These four computed x coordinates are used to define two spans of the parabola 70: a lower span 72, whose ordinates range from xA1 to xA2; and an upper span 74, whose coordinates range from xB1 to xB2. Next, two new parabolas, and spans thereof, are defined by scaling parabola 70 about its focus 68, such that the three parabolas share the same focus: a slightly larger parabola 90 and span thereof 92 generated by scaling parabola 70 and its lower span 72 by the factor xB1/xC, and a slightly smaller parabola 80 and span thereof 84 generated by scaling parabola 70 and its upper span 74 by the factor xA2/xC. Given this construction, the rightmost point 96 of the new lower span and leftmost point 86 of the new upper span share the same x coordinate of xC. These lower and upper spans are joined by a vertical segment connecting points 96 and 86.

The curve generated by this construction is then combined with its reflection through the vertical line whose x coordinate is xM1 to create the symmetric upper profile of the slat's cross-section. The slat's lower profile is a curve that lies entirely below the upper profile and relatively close to it so as not to expand the clearance profile of the slat. For a slat produced by forming flat stock such as aluminum plate, the lower profile will be approximately a parallel curve to the upper profile at a distance matching the thickness of the stock. A bevel is cut under the slat's outermost top edges to eliminate any overshoot of the slat's body beyond the profile of its upper, reflective surfaces.

FIG. 4B shows the complete profile of a slat generated using this method. The focal point 68 lying on the riser on the left half of the slat is shared by both mirror-defining parabolas on the right half of the slat: the larger parabola 90 defining the lower mirror 92 and the smaller parabola 80 defining the upper mirror 84. The same relationship holds between the focal point lying on the riser on the right half of the slat and the parabolas defining the mirrors on the left half of the slat.

Figure 5:
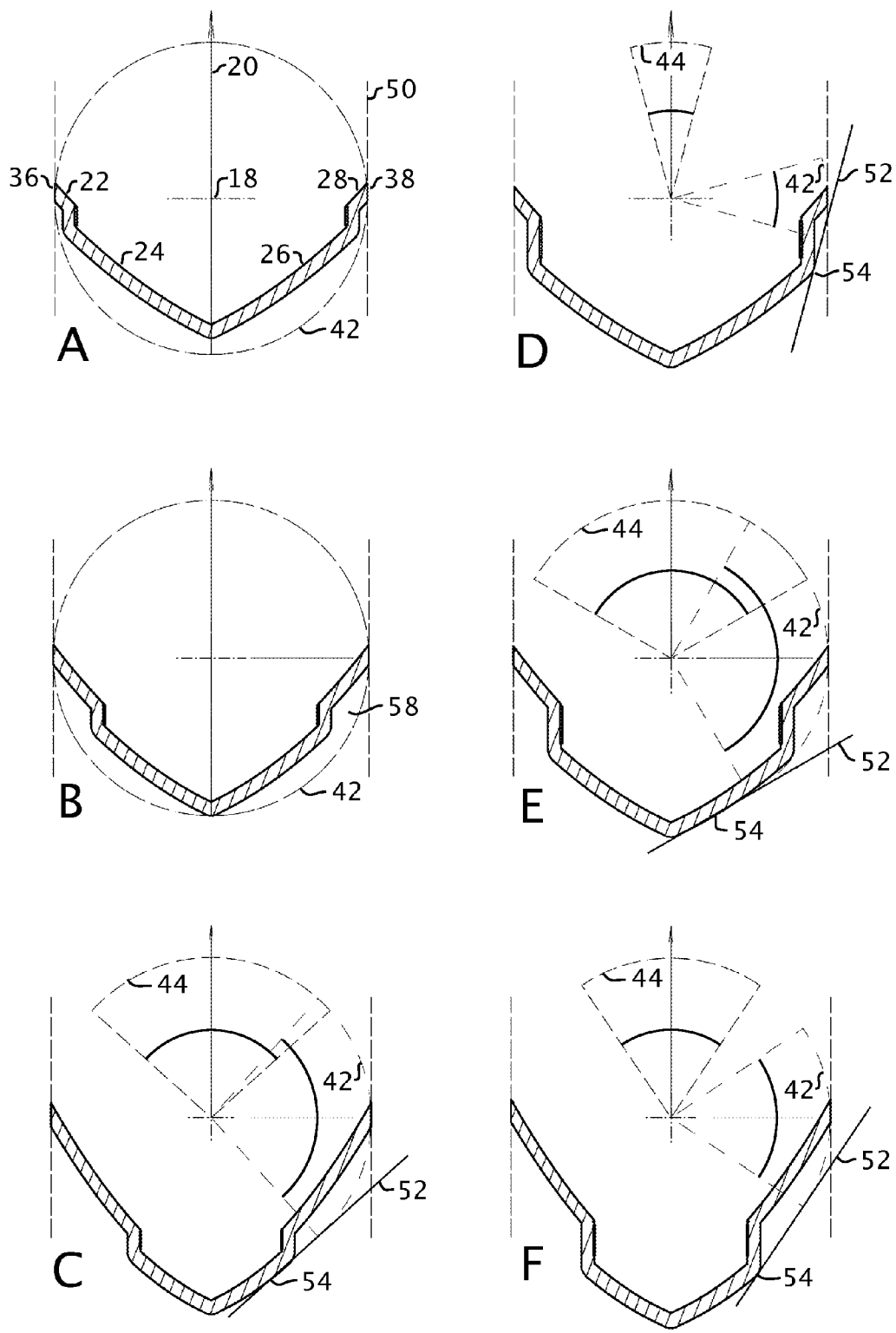

FIG. 5 illustrates the effect of varying the two design parameters xD and xE defined in the shape derivation described with reference to FIG. 4, with the values of xD increasing from the page's left to right, and the values of xE increasing from the page's top to bottom.

For each of the cases A through D, the dashed arc 42 indicates the path swept out by the slat's edge 38 as the slat is moved through its range of angular motion, and the dashed arc 44 indicates the path swept out by the slat's normal vector 20. That range of motion is constrained by the requirement that the slat not protrude outside of its zone in the array indicated by the vertical lines 50. Given a wall whose left profile corresponds to the line 50, rotation of the slat in cases C through F causes it to collide with the wall at the points 54, where the lines 52, indicating a rotated image of line 50 about the pivot point 18, meets the outside surface of the slat. In cases A and B the slat can be rotated through 360 degrees without experiencing such a collision.

FIG. 5 shows that certain ranges of values for xD and xE produce slat profiles with better ranges of angular motion. Increasing the value of xD—the parameter that determines the height of the vertical risers—increases the portions of the slat profiles that extend outside of the clearance profiles of the slats' edges, decreasing the slats' range of motion. Likewise, larger values of xE—the parameter that determines the relative widths of the upper parabolic mirrors 22 and 28—increases the portions of the slat profiles that extend outside of the clearance profiles of the slats' edges, also decreasing the slats' range of motion. Of the six different profiles shown, A and B have the advantage that they may be rotated through the entire 180-degree range of useful angles without the possibility of colliding with a neighboring slat. Of these, profile B is generally more desirable for at least three reasons: first, it affords more space in the region 58 immediately behind the receiver and within the circular clearance profile corresponding to arc 42 for mounting heat sinks, fluid conductors, electronics or other such equipment; second, it reflects light to the receivers with a lower average angle of incidence, improving the performance of the receiver; and third, it positions the receivers where they are in closer average proximity to the mass of the slat's body, providing better thermal performance for embodiments that use the slat as a heat sink. Likewise, profile E is generally preferable to D and F for the same reasons: in addition to having a much larger range of motion than either, it has the aforementioned benefits of the placement of the risers close to the midpoints of the slat's respective sides.

As FIG. 5 shows, the simplest form of the invention benefits from the placement of the risers close to half way between the bottom vertex and top edges of the slat. Persons skilled in the art will appreciate that more complex forms of the invention are guided by similar design rules. For example, when the number of risers is multiplied, it is beneficial to space them at relatively equal intervals.

Rooftop Concentrating Photovoltaic Panel: FIGS. 6 through 13

Figure 6:
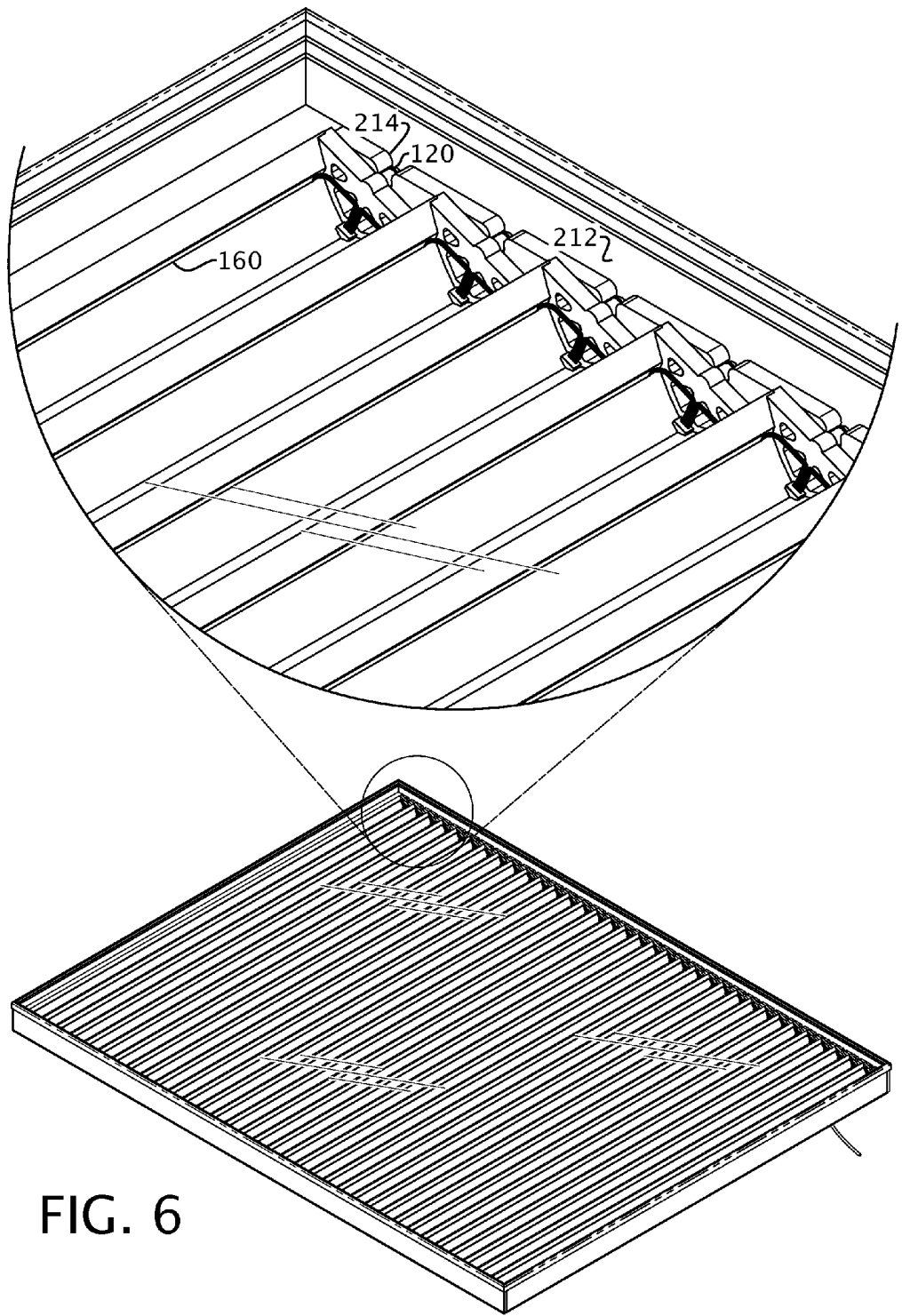
FIGS. 6 through 13: Rooftop Concentrating Photovoltaic Panel

The first complete embodiment of the invention, a concentrating photovoltaic panel suitable for installation on rooftops, is described with reference to FIGS. 6 through 13. FIG. 6 is an isometric view of a panel in which the panel's 34 slats are visible beneath the enclosure's transparent glazing. The detail view occupying the figure's upper portion shows the ends of five slats articulated with the enclosure's side wall 212 via the pivotal mounting of the slats' axle pegs 120 in the slat axle sockets 214 integral to said side wall. Said sockets are open at the top so that the slats can be removed by pulling them upward with a gentle force. In this view, only one of each slat's photovoltaic strips 160 is visible.

Figure 7:
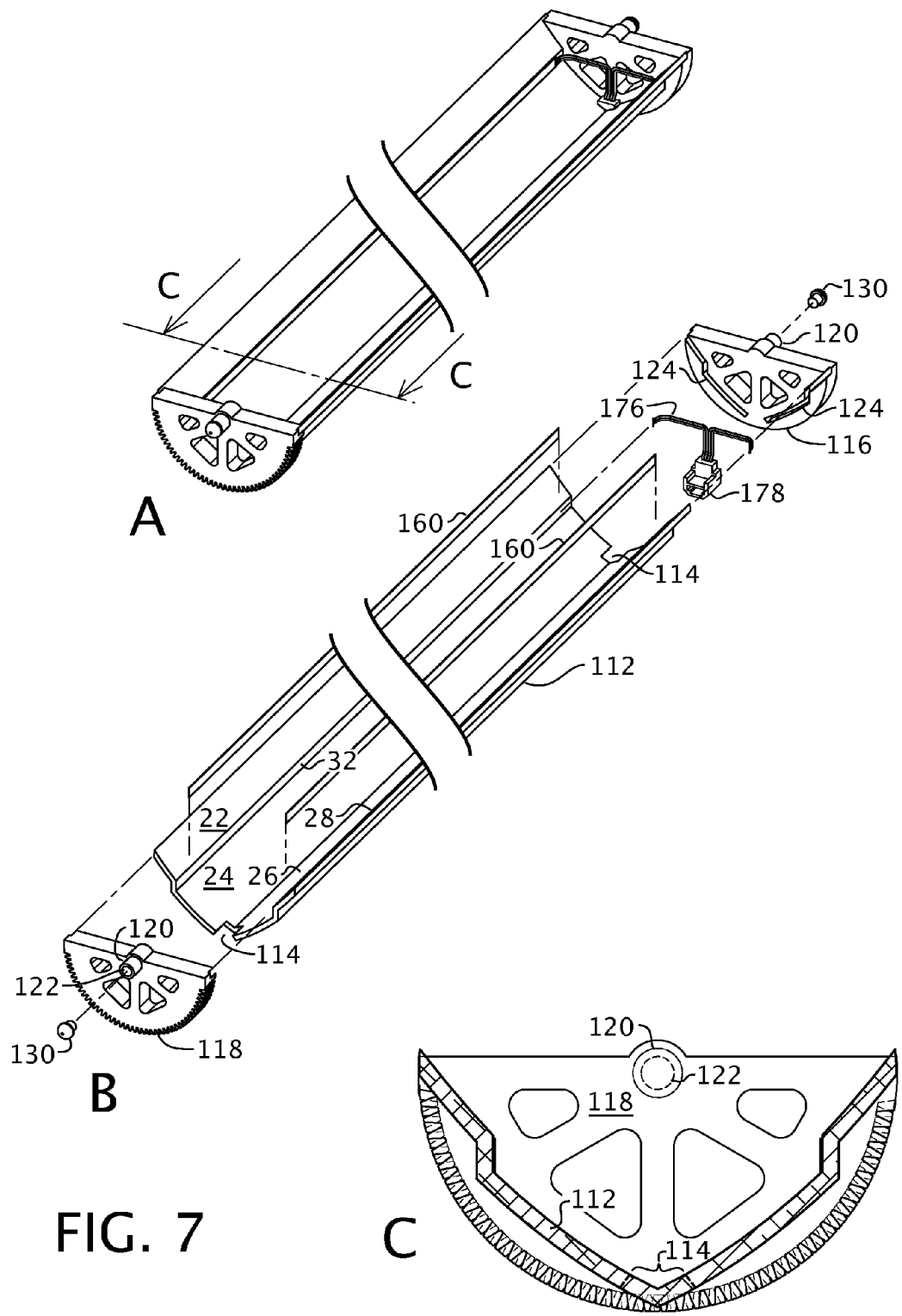

FIG. 7 shows views of a single slat. FIGS. 7A and B show assembled and exploded isometric views of the slat with most of the slat's length between its two ends omitted, and FIG. 7C shows the cross-section indicated in FIG. 7A. The slat comprises the slat body 112, having the mirrored surfaces 22, 24, 26, and 28; the two end caps 116 and 118; the photovoltaic strips 160, and the flat electrical cable 176 and integrated connector 178 Each of said end caps has a pair of channels 124 shaped to accept and end of the slat body so as to rigidly mate with it, and an axle peg 120 having a co-axial cavity 122 that accepts the flexible axle spacer 130. The end cap 118 differs from the end cap 116 in that the semi-circular portion of the former's perimeter is geared with helical teeth so as to mesh with a worm of the wormed shaft shown in FIGS. 8,9, and 11. Said slat body has the notches 114 at both of its ends. At the end mating with the geared end cap 118, the notch allows the end cap's gear teeth to have the necessary depth. At the end mating with the end cap 116 the notch provides an opening for the passage of the connector 178 from the upper side of the slat body to its underside while also securing it.

Figure 8:
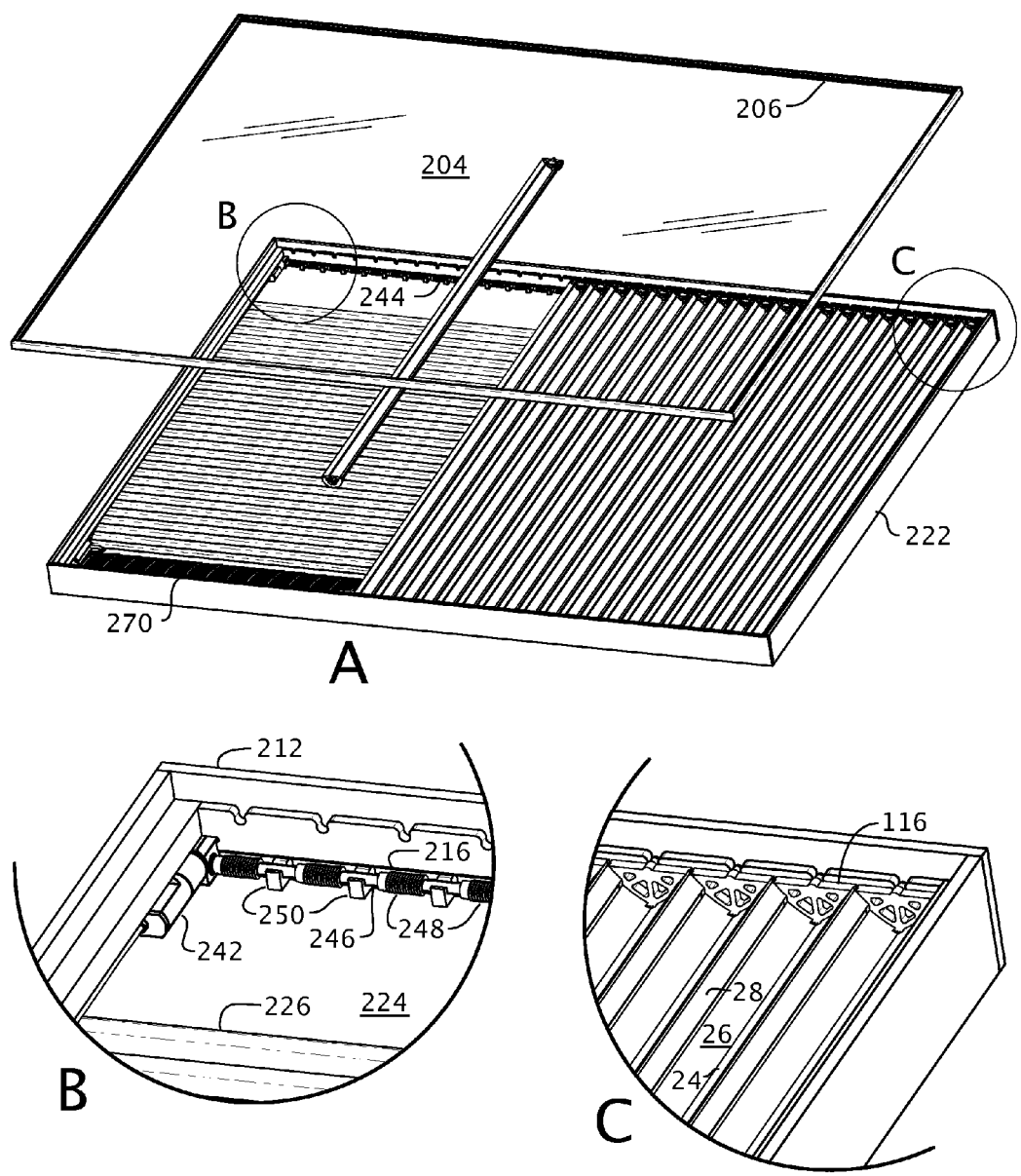

FIG. 8 shows the panel in a state of partial dis-assembly. FIG. 8A shows the removable cover, comprising the transparent glazing 204 and the cover frame 206, lifted up, a single slat suspended above the panel, and 20 of the panel's full complement of 34 slats installed. FIG. 8B is a detail view showing portions of the drive mechanism, including the shaft-mounting gearmotor 242 and a span of the worm shaft 244 which it mounts, said shaft comprising the keyed axle rod 246 and the worms 248 rigidly mounted thereupon with a spacing matching that of the slats. The shaft support blocks 250, which snap into the channel 216 in the side wall 212, maintain said worm shaft in a precise position throughout its length. The back wall 224, formed of a thin heat-conductive material, has the corrugations 226 spanning the panel's long (height) dimension and most of the panel's shorter (width) dimension, being flat near each of the panel's sides to accommodate drive and electrical components. The corrugations serve to stiffen the back wall and provide increased surface area for the dissipation of heat. FIG. 8C is a detail view showing portions of several slats, which are oriented in the panel's normal direction. Broad portions of the parabolic cylinders 26 and 28 are visible, as are narrow portions of the parabolic cylinders 24.

Figure 9:
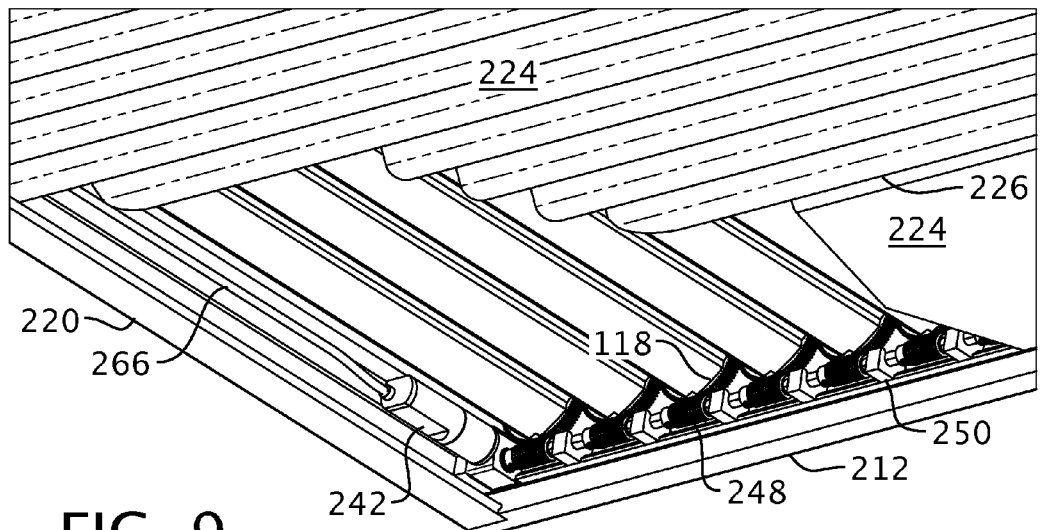

FIG. 9 shows the underside of the corner of the panel containing the gearmotor 242, where a portion of the back wall 224 has been cut away to reveal portions of the drive mechanism. The worm gear teeth of the slat end caps 118 are meshed with the worms 248.

Figure 10:
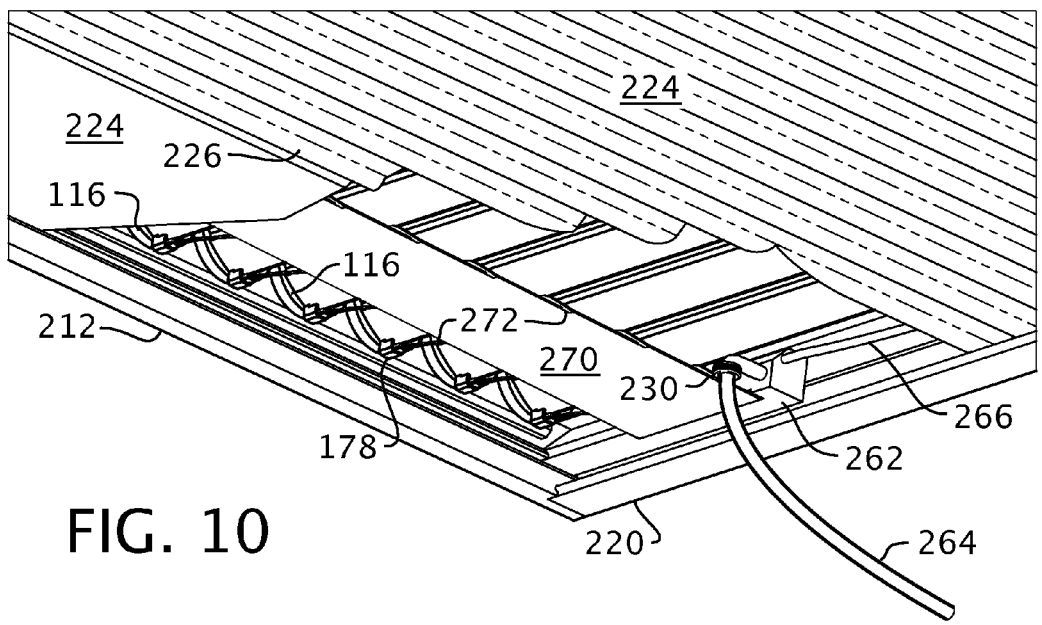

FIG. 10 shows the underside of the corner of the panel directly opposite that shown in FIG. 9, where a portion of the back wall 224 has been cut away to reveal portions of the panel's electronics. The electronics module 262, which contains a microcontroller, has three electrical cables emerging from it: the motor cable 266, which supplies power to the gearmotor 242; the external power cable 264, which passes through a hole in the back wall sealed by grommet 230; and the branched ribbon cable 270, which provides individual conductive paths between each slat and said electronics module. Said ribbon cable has a branch 272 for each of the slats, each branch comprising a flexible strand and a connector that mates with the slat connector 178 to provide three conductive paths from the slat to said electronics module. The electronics of the panel is described in more detail below with reference to FIG. 13.

Figure 11:
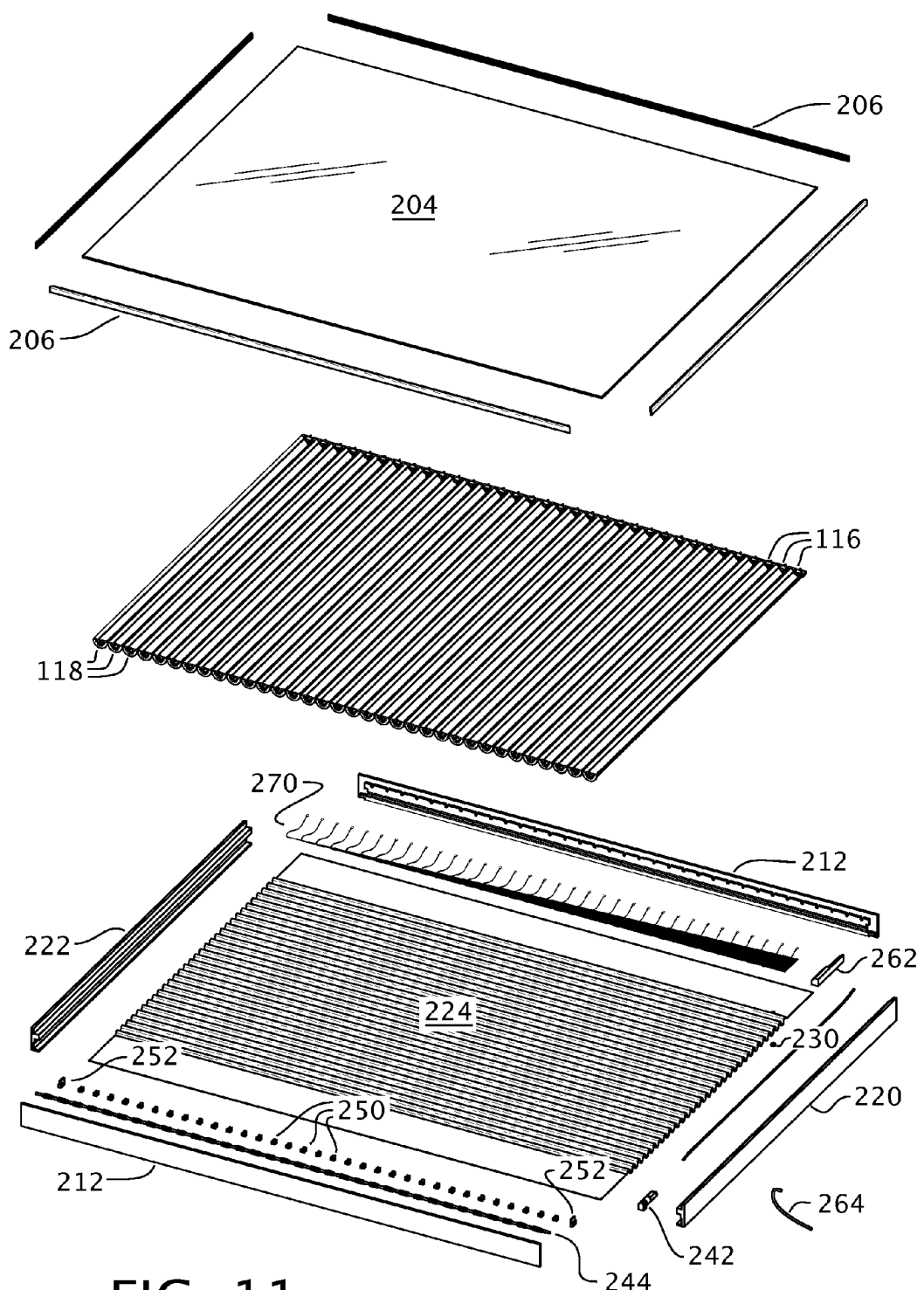

FIG. 11 shows an exploded view of the panel, in which the components of the panel enclosure are separated. The panel's cover, shown in the upper portion of the page, has its four frame components 206 pulled away from the transparent glazing 204. The slats, shown in the middle portion of the page, are oriented in the panel's normal direction, and are spaced as they would be when installed in the panel. The parts of the panel enclosure other than the cover are shown in the bottom portion of the page. All of the numbered parts are identified above in the descriptions of FIGS. 6 through 10, with the exception of the shaft axle sockets 252, which fit into recesses in the top and bottom frame walls 222 and 220, and rotatably mount the worm shaft 244 at its two ends.

Figure 12:
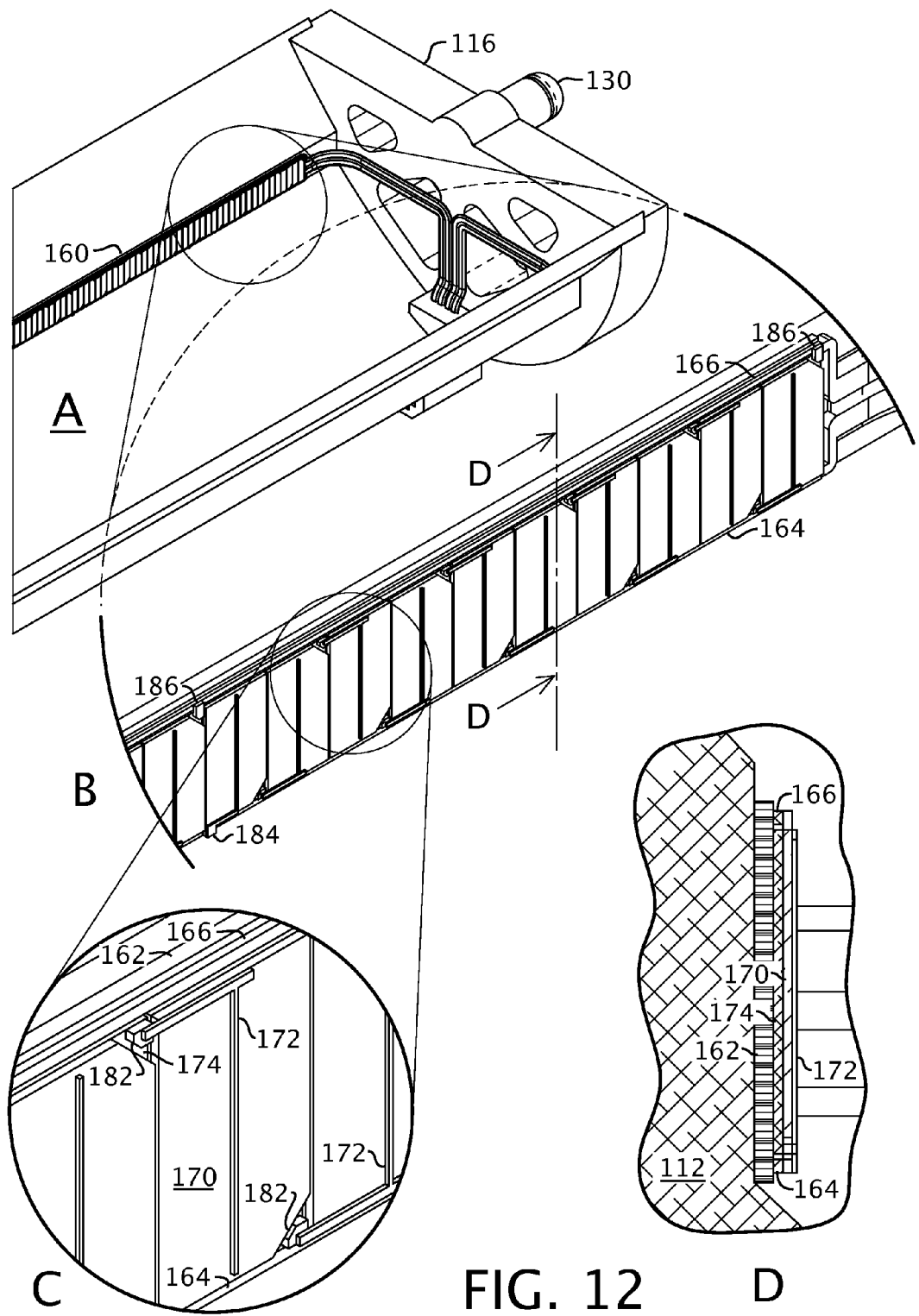
Figure 13:
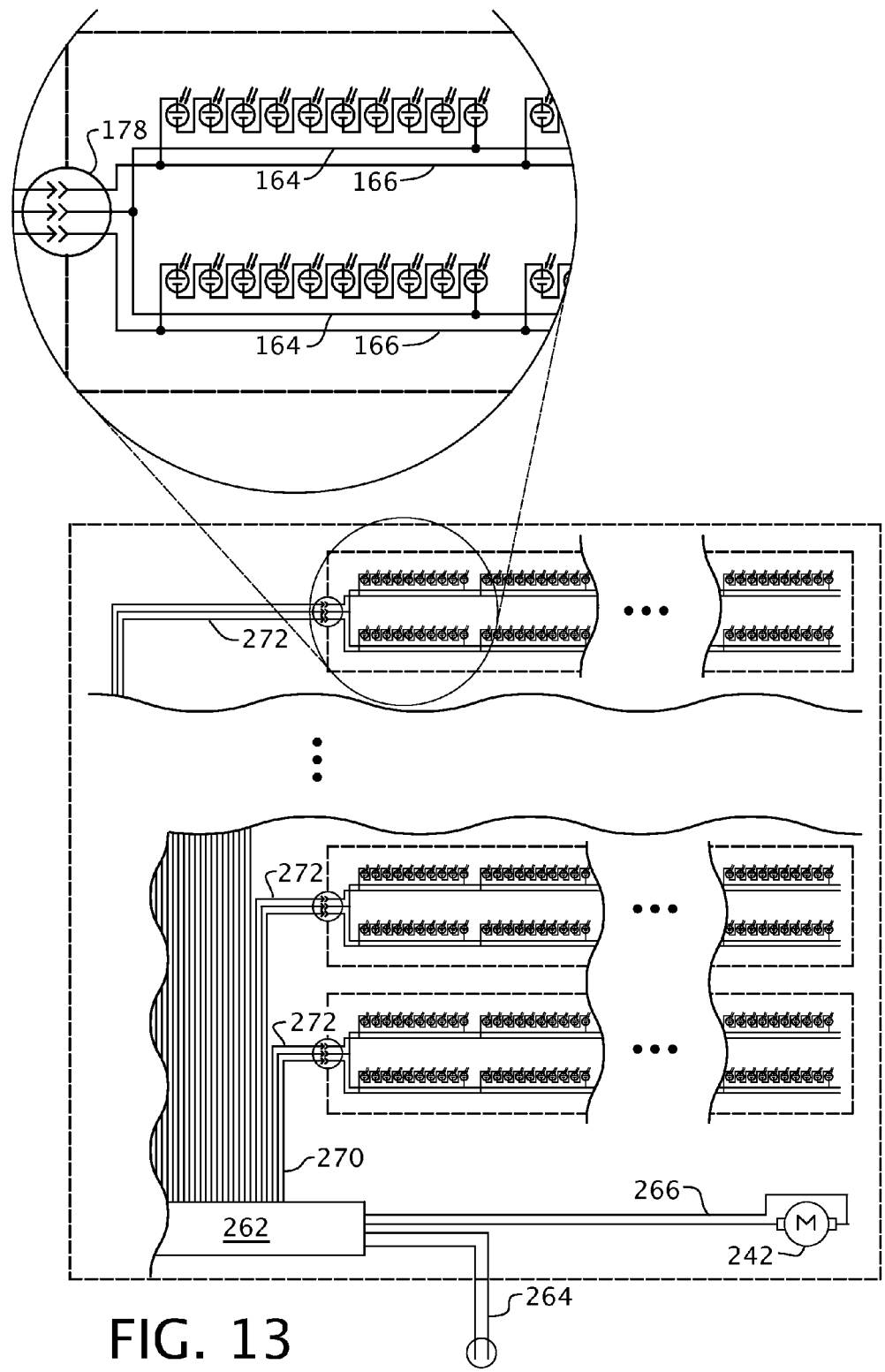

FIG. 12 shows details of the photovoltaic strips 160 that convert light energy focused thereupon into electrical energy. Because the strips have small-scale structure, FIG. 12 provides two levels of magnification and a cross-section of portions of a strip. FIG. 12A shows the end of a slat in which approximately one thirty-second of the length of one of the slat's two strips is visible. FIGS. 12B and C show two magnifications of that strip, and FIG. 12D shows a cross-section through the strip and the slat body on which it is mounted. As illustrated in FIG. 13, described below, the photovoltaic cells in a strip are arranged in clusters of ten cells wired in series where said clusters are wired in parallel to form the circuit of a single strip. Referring to FIG. 12B, which shows the entirety of a series cluster, the series clusters are wired to conductive rails that run the length of the strip and flank the cells: the positive rail 164 and negative rail 166 running along the bottom and top of the strip, respectively. The negative and positive poles of each series cluster are connected to the positive and negative rails individually through the conducting pads 184 and 186, respectively. Referring to FIG. 12C, which shows a single cell and portions of its neighbors, a cell's back contact 174 covers the cells underside and its front contact 172 has an l-shape that overlaps a portion of the back contact of the cell to its left. The conductive pad 182 provides a conductive path from the front contact of one cell to the back contact of its neighbor, providing a series connection between the two cells.

The electrical structure of the photovoltaic strips simultaneously satisfies two important design requirements: delivering electrical output from the slats whose electromotive force is in the desirable range of five to ten volts, and avoiding significant losses due to shading of portions of a slat. The latter requirement arises from the fact that during normal operation in full sunlight, portions of the ends of the photovoltaic strips will be shaded for significant periods of time because of shadows cast by the slat's end caps and portions of the enclosure. Whereas the performance of a series circuit of photovoltaic components is greatly degraded by the shading of any one component, the performance of a parallel circuit of many photovoltaic components is only minimally impacted by the shading of one component. Because the series clusters of the present embodiment are very short relative to the strip's length, the shading of the slats' ends will have minimal impact on its electrical output.

FIG. 13 is an electrical schematic of the panel showing details of the slat's electrical circuits. The figure's main view depicts the enclosure's electrical components and those within portions of three slats, each of which has upper and lower rows of components corresponding to the slat's two photovoltaic strips. The detail view, located above the main view, shows two series clusters of cells in their entirety, one belonging to each of the slat's two strips. As described above with reference to FIG. 12, each cluster's anode is connected to the rail 164 and each cluster's cathode is connected to the rail 166. In the present embodiment, each strip has 78 series clusters. The branched cable 270, whose branches 272 connect to the slats via the connectors 178, has three dedicated conductors for each slat: a common cathode conductor, and one anode conductor for each of the slat's two strips. This electrical architecture satisfies several important design requirements. First, it allows the microcontroller 262 to monitor the difference between the outputs of each slat's two strips for the purpose of inferring the direction in which the slats' normal axes are displaced from the direction of incident light. Second, it allows said microcontroller to monitor the individual performance of each slat so as to flag slats that require service or replacement. Third, it allows the circuits of the individual slats to be isolated in case of an electrical malfunction such as a short circuit.

Figure 14:
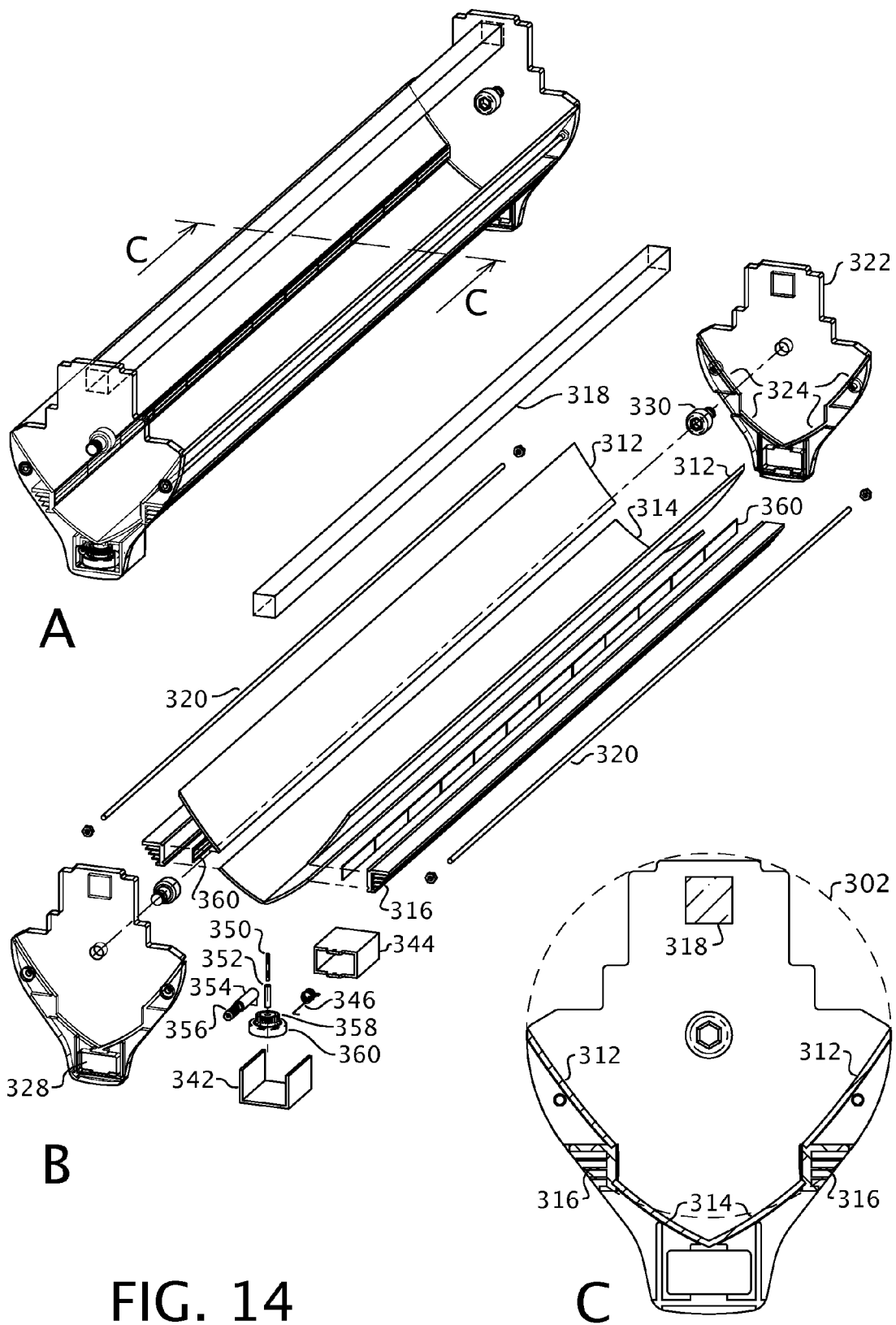
FIG. 14: Prototype Concentrating Photovoltaic Panel

Prototype Concentrating Photovoltaic Panel: FIG. 14

A single slat of a panel embodiment of the invention is shown in FIG. 14. Developed for a testbed system, this embodiment is less advantageous than the rooftop panel described above in several respects, including manufacturing simplicity and form-factor desirability. However, it illustrates several methods relating to the invention that may be desirable in certain instances.

FIGS. 14A and B show assembled and exploded isometric views of the slat, and FIG. 14C shows the cross-section indicated in FIG. 14A. In contrast to the first embodiment, whose slats have single-piece bodies, the present embodiment has slats whose bodies are assembled from several parts. The transparent end plates 328 have channels 324 shaped to accept the various parts comprising the slat body: the two upper mirror segments 312, the lower mirror segment 314, the heat sinks 316, and the glass bar 318. The end plates are held in compression relative to each other by the tensioner rods 320, thereby holding all of the above parts of the slat body in precise, rigid positions between the end plates. The compression forces may be borne entirely by the said glass rod and heat sinks thereby avoiding possible distortion of the mirror segments due to compressive forces. The photovoltaic cell assemblies 360 are mounted upon said heat sinks.

In contrast to the first embodiment, each slat of the present embodiment has a dedicated drive system to maintain alignment of the slat's optical axis with the direction of incident light. The drive system comprises, in part, the gearmotor 354, the worm 356 axially mounted thereupon, the worm gear 358 that meshes with said worm, the wheel 360 attached to and coaxial with said worm gear, the axle rod 350 and axle shaft 352 mounting said wheel and worm gear for rotation, the sliding inner housing 344 mounting said axle rod and gearmotor, the fixed outer housing 342 pressure fit into channels in the end plate 328 and slidably mounting said inner housing, and the spring 346 that applies and outward pressure to said inner housing and its contents. The axle bolts 330 pass through holes in said end plates and securely fasten to the walls of the panel enclosure (not shown) thereby pivotably mounting the slat. The drive wheel 360 engages a grip on the same enclosure's facing wall and, driven by said gearmotor, effects angular movement of the slat relative to the enclosure.

Unlike the slats of the first embodiment, the diameter of clearance profile of that shown in FIG. 13 is larger than its aperture width, where the latter equals the diameter of the arc 302 swept out by the out mirror edges. Therefore such slats arranged in a close-packed array cannot tilt to 90 degrees away from the array's normal direction without colliding. However, owing to the shape of the slat, whose portions lying outside of the arc 302 are restricted to the slat's lower angular potions, such slats in a close-packed array are able to rotate up to 65 degrees before colliding, providing adjacent slats are tilting to roughly the same degree.

Figure 15:
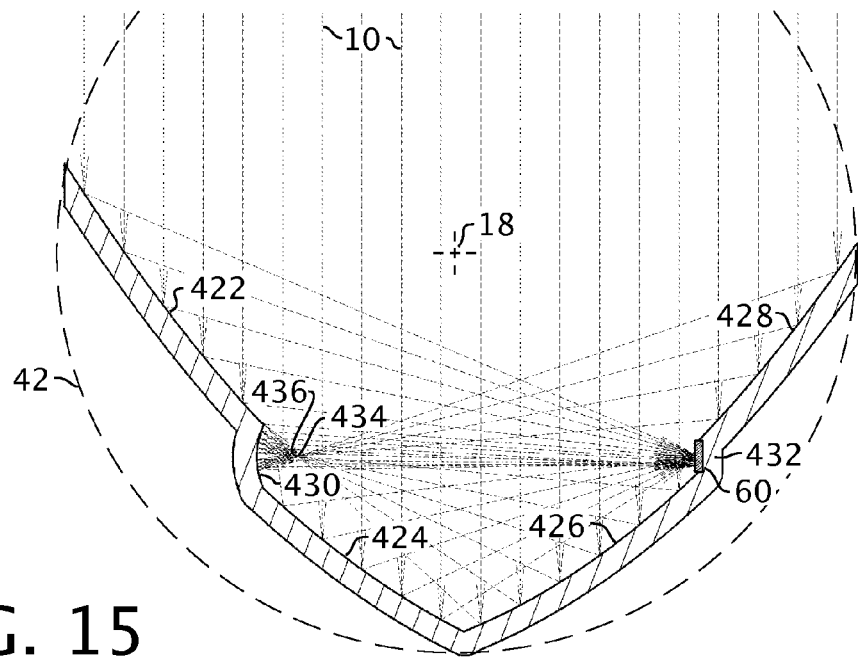
FIGS. 15 and 16: Asymmetric Slat Profiles
Figure 16:
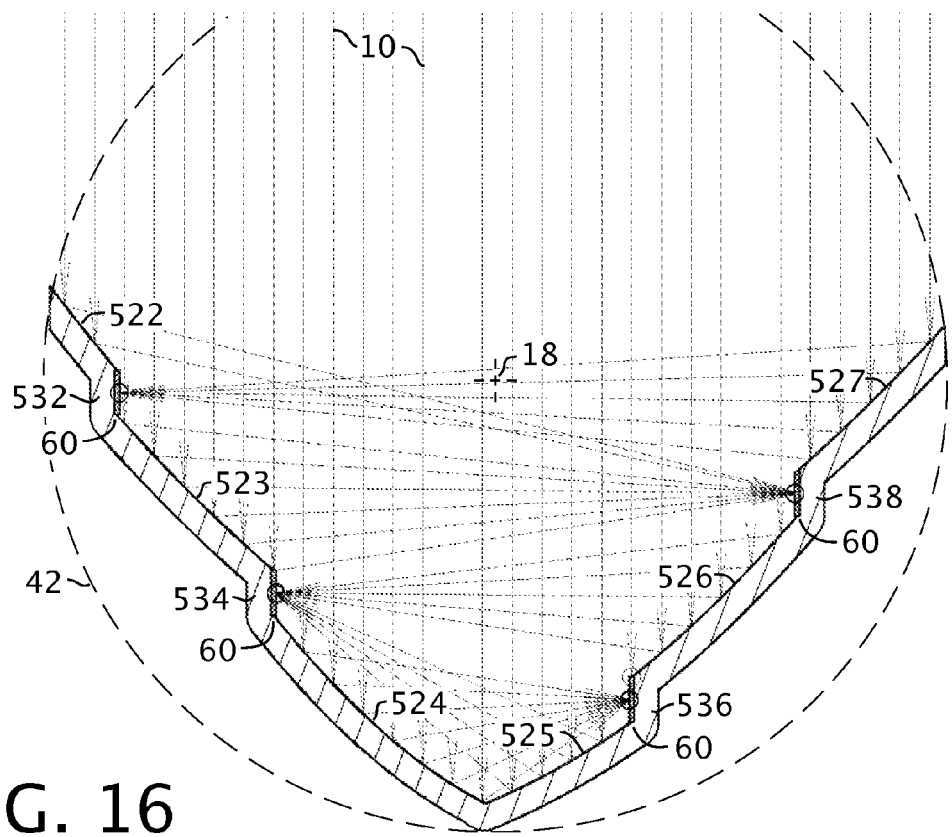

Asymmetric Slat Profiles: FIGS. 15 and 16

FIGS. 15 and 16 show the profiles of slats in embodiments of the invention having different optical geometries than the simplest form, as shown in FIGS. 2 through 14. They show variations of one-axis reflectors that are less symmetric and more complex than the simplest form.

FIG. 15 shows a cross-section through a slat whose geometry is similar to that of the first embodiment, but which has a secondary mirror in place of one of the two receivers. The secondary mirror 430 is a parabolic cylinder whose defining parabola's axis is horizontal and perpendicular to those of the primary mirrors 422, 424, 426, and 428. Like the single receiver 60 mounted on the riser 432 between the primary mirrors 426 and 428, the vertical orientation of the secondary mirror 430 between the primary mirrors 422 and 424 assures that it is hidden from the parallel directional light 10 when the slat is oriented. The secondary mirror 430 is positioned and shaped such that it captures directional light reflected by primary mirrors 426 and 428 and reflects it a second time to focus it on the receiver 60. Thus, an oriented slat focuses all if its captured incident light on the receiver, combining the light reflected directly from the mirrors 422 and 424 with the light reflected indirectly from the mirrors 426 and 428 via the secondary mirror 430.

The secondary mirror 430 has a parabolic profile whose focus 436 is slightly to the left of the shared focal point 434 of the mirrors 426 and 428. As a result, the light reflected by the secondary mirror converges before reaching the receiver, rather than remaining parallel as would be the case if the points 434 and 436 were coincident.

A slat could employ one or more secondary mirrors, and those mirrors would not need to have parabolic profiles in order to focus reflected light on the receivers. For example, it is possible to design a slat geometry with secondary mirrors having convex elliptical profiles.

FIG. 16 shows a cross-section of a slat having three mirrors and two receivers on each of its facing sides in an asymmetric shape that roughly approximates a chevron making a 90-degree angle. In this embodiment, a properly oriented slat directs incident directional light 10 as follows. Light falling on the mirrors 522 and 523 is reflected to the receiver on the riser 538, light falling on the mirror 524 is reflected to the receiver on the riser 536, light falling on the mirrors 525 and 526 is reflected to the receiver on the riser 534, and light falling on the mirror 527 is reflected to the receiver on the riser 532.

Slat geometries having larger numbers of mirrors and receivers may have particular advantages in some applications of the invention. Compared to a single receiver on each transverse half of the slat, a series of smaller evenly spaced receivers would increase the ratio of conductive material to photosensitive material in the immediate vicinities of the focal lines, providing more effective conductive heat dissipation for a given size of slat.

Window with Retracting Photovoltaic Concentrator: FIGS. 17 through 26

The second complete embodiment of the invention, a multi-function window with a retracting photovoltaic concentrator, is described with reference to FIGS. 17 through 26. FIG. 17 shows a trimetric view of the window whose concentrator is deployed and its slats tracking the sun. FIG. 18 shows a trimetric view of the same window whose concentrator is retracted, providing an unobstructed view through the window. FIGS. 17 and 18 show the embodiment in two of its three modes. In a third mode, the deployed concentrator shutters closed to prevent radiative heat loss between the interior and exterior space separated by the window.

Figure 19:
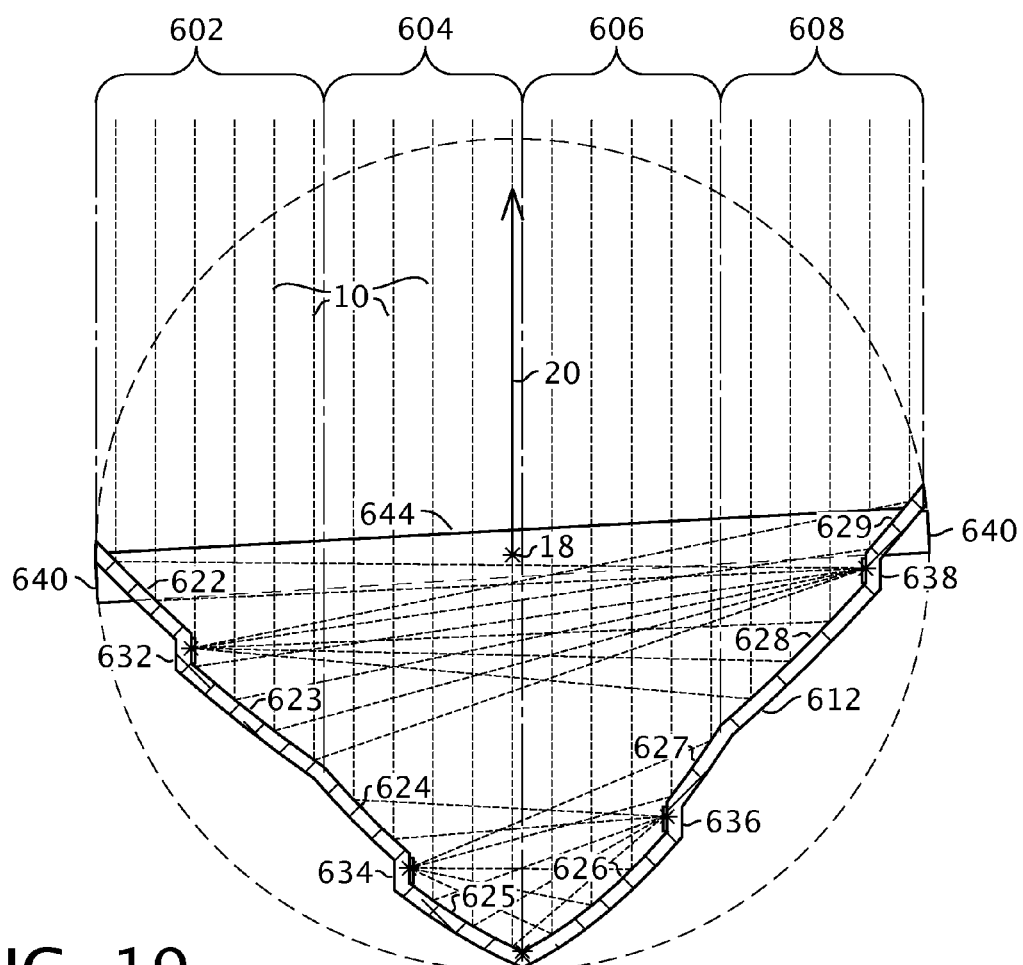

FIG. 19 illustrates the optical geometry of the slat used in the window embodiment, showing the cross-section of a slat whose normal direction 20 is aligned with the vertical axis of the page, and the paths taken by rays of directional light 10 falling on the slat. The geometry is similar to that of the slat illustrated in FIG. 16 but differs in having eight mirrors instead of six, and thereby roughly equalizes the quantity of light convergent on each of the four receivers. In this embodiment, a properly oriented slat directs incident directional light 10 as follows. Light falling on the mirrors 622 and 623 is reflected to the receiver on the riser 638, light falling on the mirror 624 and 625 is reflected to the receiver on the riser 636, light falling on the mirrors 626 and 627 is reflected to the receiver on the riser 634, and light falling on the mirrors 628 and 629 is reflected to the receiver on the riser 632. The horizontal span of each pair of mirrors sharing the same target receiver are approximately equal, as can be seen by the partitioning of incident light into bands according to the receiver it is directed to. Thus, incident light in the bands 602, 604, 606, and 608 is reflected to the receivers at the risers 638, 636, 634, and 632, respectively.

The line 644 spanning the slat's width is the profile of the upper face of the slat's end plates 640, which are seen more clearly in FIG. 21. The end plates are tilted slightly about the slat's pivot axis 18 with respect to the plane perpendicular to the slat's normal direction 20 to enable adjacent slats to stack compactly, where every other slat is rotated 180 degrees about an axis perpendicular to the plane of its end plates.

Figure 20:
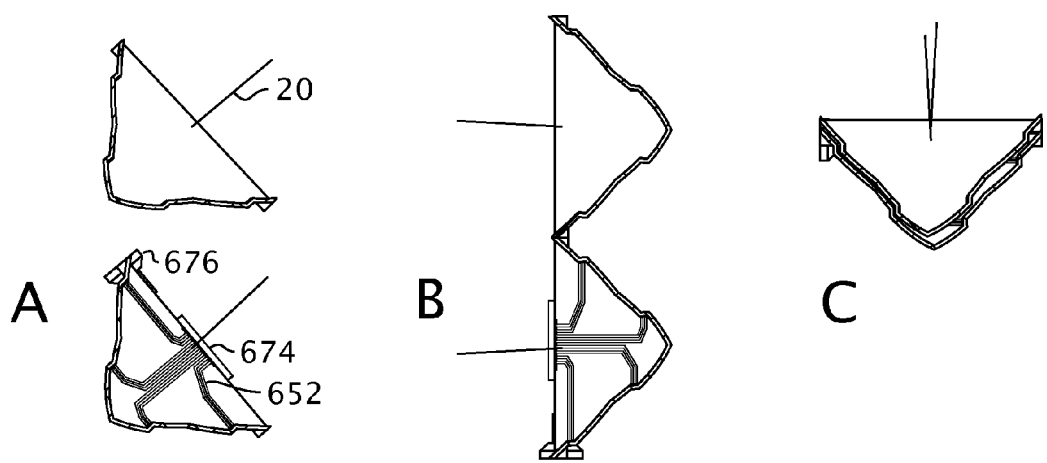

FIG. 20 shows cross-sections through a pair of adjacent slat assemblies in each of the embodiment's three modes: energy capture (A), shuttered (B), and refracted (C). The flat cable 652, gearmotor 674, and tilt wheel 676 are visible only in the lower slat assembly of each pair because only one end of each slat is equipped with these components, and that end is seen only in the lower slat assembly, which is flipped relative to the upper assembly. In the energy capture mode shown in FIG. 20A, the normal directions 20 of the slats are parallel because both are aligned with the direction of incident light. In the shuttering mode shown in FIG. 20B, the end plates of the slats are co-planar, and the edges of the slats touch, creating a barrier to convective and radiative heat loss. In the refracted mode shown in FIG. 20C, the end plates of the slats are parallel and stacked against each other, and the slat profiles seen in cross-section nest compactly.

FIG. 21 shows views of a single slat and its associated hanger assemblies. FIGS. 21A and B show assembled and exploded isometric views of a slat and said assemblies with most of the slat's length between its two ends omitted. The slat assembly consists of various small components and the single-piece slat body, whose main features are the elongate V-shaped trough forming the parabolic cylinders and risers described with reference to FIG. 19, the sloping ends of said trough, the sculpted end plates 640, and the axle pegs 642. The slat assembly's components include: the photovoltaic strips 650; the branching flat cable 652; the electronics module 660 incorporating the conductors 662, the microprocessor 664, and the axle electrical contacts 666; and the tilt drive assembly, comprising the spring bracket 672, the tilt gearmotor 674, and the tilt wheel 676.

The hanger assembly, a pair of which pivotably mounts the slat assembly at the latter's two ends, comprises: the support bracket 682, having the axle socket 684, the strap grooves 686 and the cable eyelets 688; the shape-retaining strap 690, having the cut-outs 692; and the strap anchor shims 696.

FIG. 22 shows three views of an assembly consisting of four adjacent slats and the hanger assemblies connecting them, where the hanger straps 690 are in their relaxed position, bent slightly outward. Because the straps deflect away from the tilt wheels 696, the wheels cannot get fraction except when the slats are facing directly upward. Consequently, the slats automatically align facing upward.

FIG. 23 shows two views of the assembly shown in FIG. 22 in which tension applied to the straps 690 pulls them taught, such that the tilt wheels 676 engage them regardless of the tilts of their slats, and said tilt wheels are able to drive their respective slats to any tilt angle. In the figure, all four slats are facing directly to the right, with their normal axes aligned with the array's normal axis.

Figure 24:
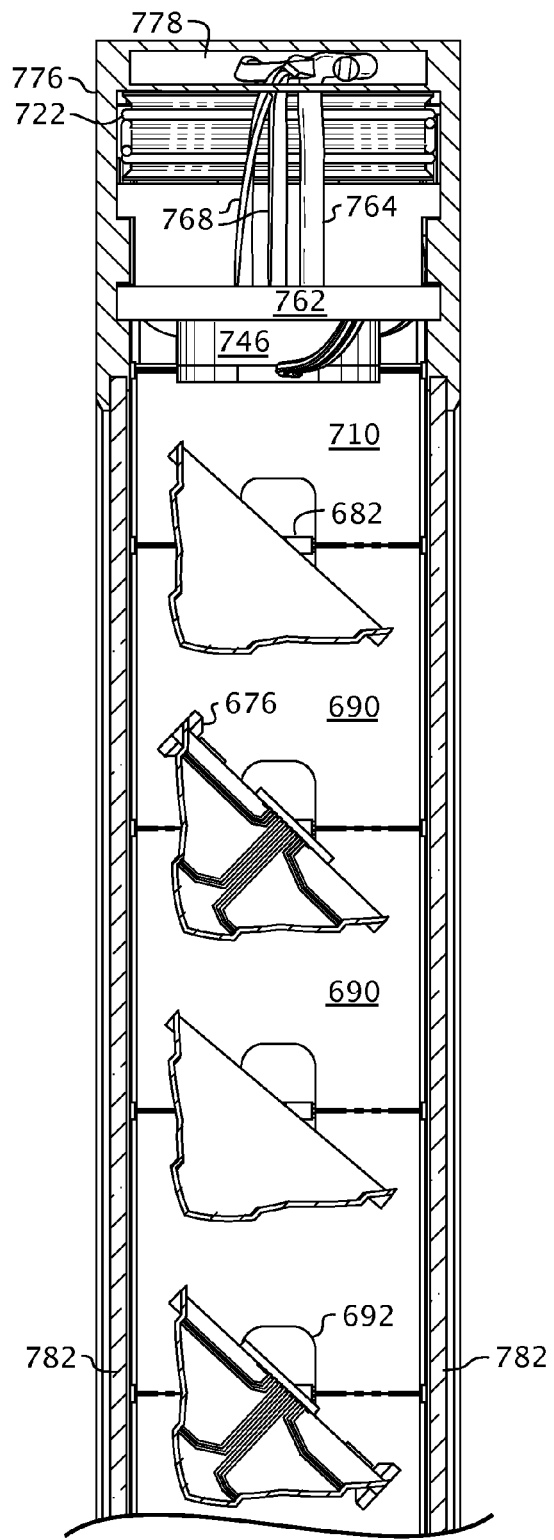
Figure 25:
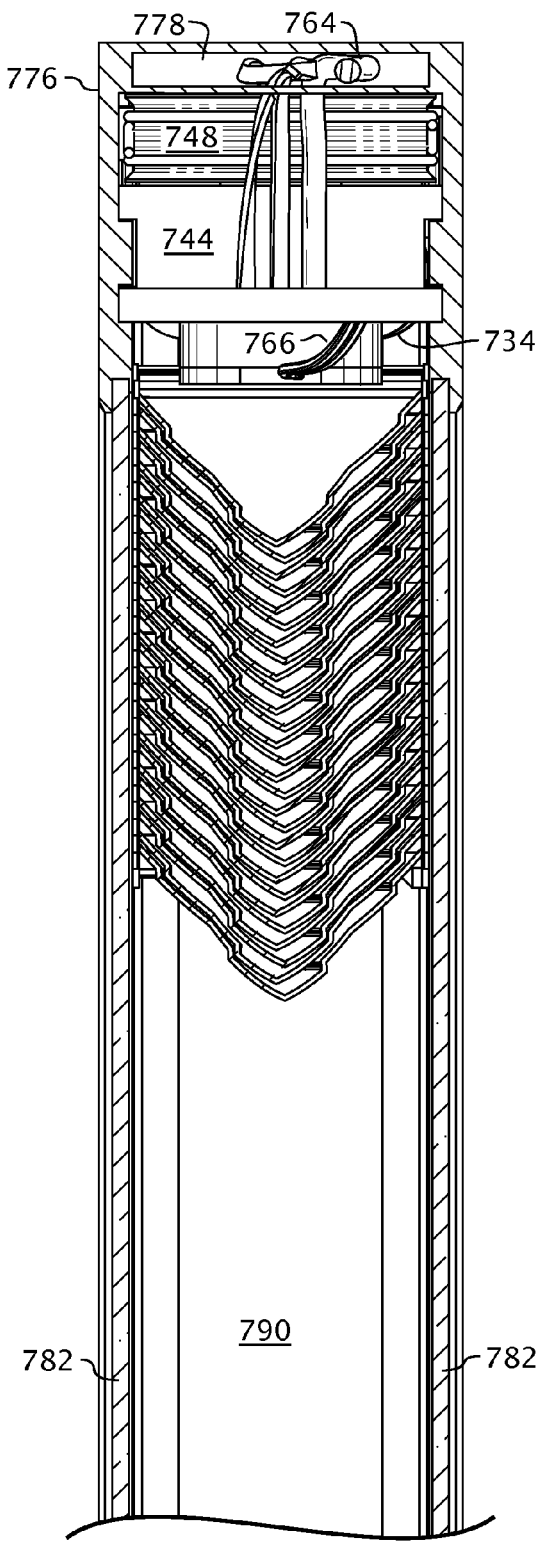

FIGS. 24 and 25 show cross-sections through the upper portion of the embodiment. FIG. 24 shows the concentrator system deployed in its energy capture mode, and FIG. 25 shows the concentrator in its retracted position. In both figures, the section plane is above window's mid-plane. Features of concentrator system labeled in these cross-sections are described in other figures, such as FIG. 26, described below. Features of the enclosure include the parallel panes of glazing 782, the top frame component 776, with its top channel 778 providing a path for wires, and the side frame component 790.

Figure 26:
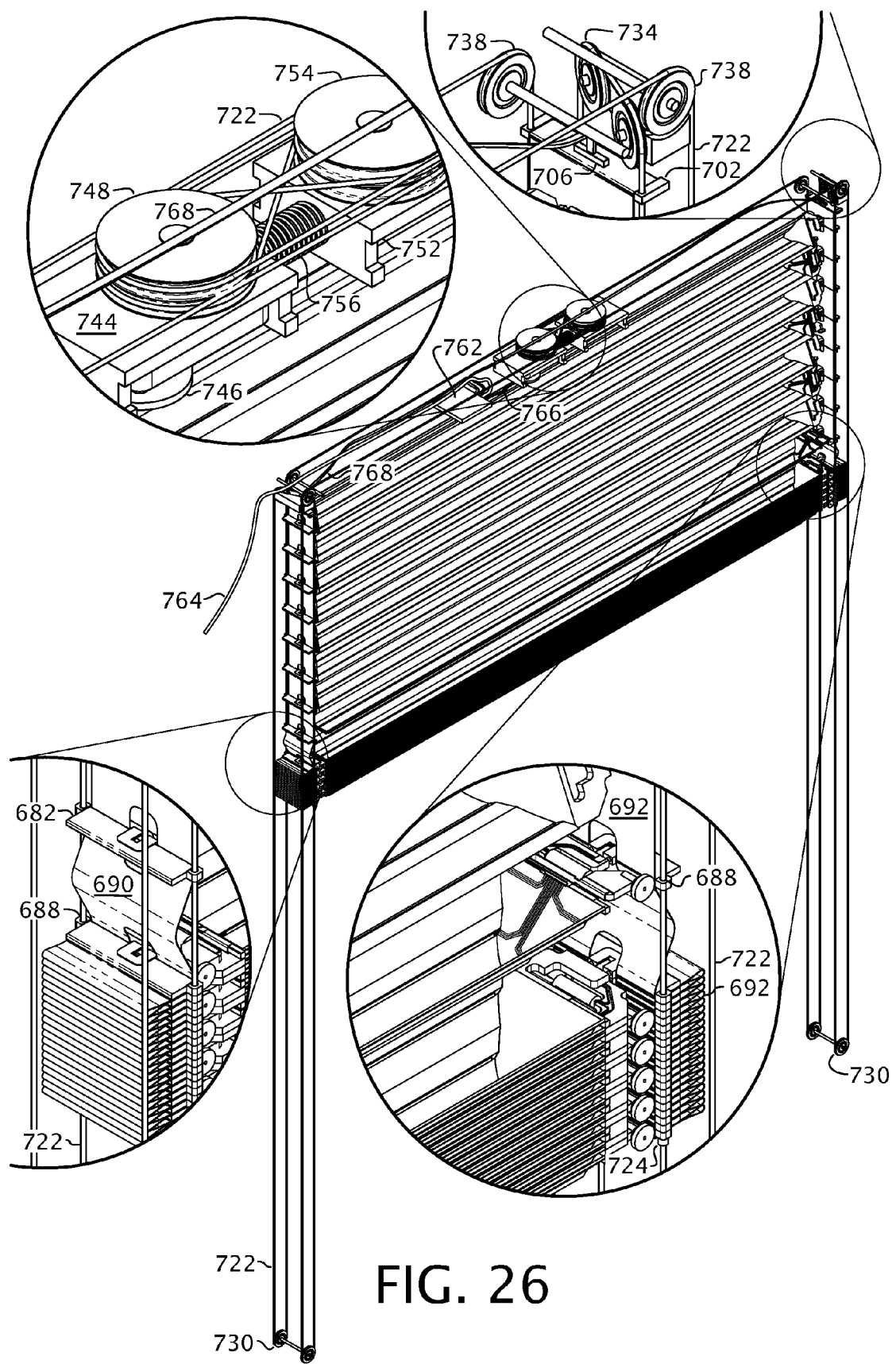

FIG. 26 shows the retracting concentrator system revealed by hiding the window's exterior frame and glazing, where said system is in a state of partial refraction. The main view of the system is supplemented by four detail views. The retraction mechanism uses a single continuous loop of cable 722 to deploy and retract the array of slats, where the cable runs along the sides and top of the system, is guided by the four bottom pulleys 730 the four cross pulleys 734 and the four corner pulleys 738, and is moved by the drive mechanism magnified in the detail view in the figure's upper left portion.

The drive mechanism, which functions to move the cable in either direction and to maintain its tension even as it stretches slightly over time, comprises two assemblies: a drive assembly that is rigidly mounted in the top component of the window frame 776, (seen in cross-section in FIGS. 24 and 25) and a sheave assembly that is slidably mounted in said component. The drive assembly comprises the drive block 744, the dual-groove spool 748 rotatably mounted on a spindle integral to said block, the gearmotor 746 that controls the rotation of said spool. The sheave assembly comprises the sheave block 752, the dual-grove spool 754 rotatably mounted on a spindle integral to said sheave block, and the spring 756 mounted on a process in said block and compressively loaded against the drive block 744. The cable 722 makes two circuits through the drive mechanism, in each case passing by the first spool, wrapping about 220 degrees around the second spool, crossing back to the first spool and wrapping about 220 degrees around it then passing back by the second spool. The span of cable that enters the mechanism from the front left as seen in the figure engages the lower grooves of the spools and exits to the back right, and the span that enters from the front right engages the upper groves of the spools and exits to the back left.

The cable 722 has eight spans that run between the bottom pulleys 730 and the top pulleys 734 or 738, and these can be divided into the four outer spans situated just beyond the edges of the folded straps 692 and the four inner spans that thread the eyelets 688 in the hanger brackets 682. Four bead-like nodes 724 are fixed to the cable at each of four points along said inner spans at the same height, and the pair of hanger brackets mounting the bottom-most slat are each secured to two of these nodes via their respective eyelets. The routing of the cable is such that when the cable moves under the influence of the drive mechanism, said nodes belonging to all four said inner spans move in unison in the same direction, and maintain the same height, thereby assuring that the four points holding the bottom-most pair of hanger brackets remain parallel and perpendicular to the window's vertical walls.

To deploy the concentrator, the drive spool 748 rotates in a clockwise direction as seen in FIG. 26, causing the four nodes 624 and the bottom-most hanger pair secured thereto to descend. As said hanger reaches the reaches its deployed position, the hanger straps 690 become taught, ensuring equal spacing of the slats, and providing surfaces upon which the slats' tilt wheels 676 can gain fraction. To retract the concentrator, the drive spool 748 rotates in a counter-clockwise direction, causing the four nodes and the bottom-most hanger pair to ascend. As the hanger straps relax, they bend outward, causing the slat's tilt wheels to loose fraction and the slats to thereby assume an upward-facing position that allows them to stack compactly as the bottom-most slat ascends.

Referring to FIGS. 24 through 26, an electronics module 762 mounted in the window frame's top component 776 contains a microprocessor and a wireless communication device allowing the panel's modes to be controlled via a hand-held remote-control unit. Said module is equipped with the electrical cable 764 to send and receive power and data from an external electrical system, a wire 766 supplying power to the retractor drive motor, and a pair of electrical cables linking it to electrical connectors in the pair of electrical cables 768 that plug into connectors 706 in the top pair of hanger brackets 702 to provide electrical connectivity to the slats assemblies. Conductors embedded in the hanger brackets 702 and 682 and in the hanger straps 690 provide conductive paths from the connectors 706 to each of the slat assembly's axle electrical contacts 666, and thereby provide circuits between said electronics module and the electrical systems of the slats. These circuits are parallel, enabling two conductive paths traversing said hanger brackets and straps on each side of the concentrator assembly to serve all of the slats, and summing the electrical current delivered by the slats when operating in their energy-gathering mode. These circuits also provide a constant voltage to power the slats' electronics when they are in other modes. The same conductive paths are used for two-way communication between the electronics module 762 and the slats' microcontrollers 664, using digitally encoded signals that are superimposed on and do not interfere with the delivery of analog power.

When the concentrator array is in its energy collecting mode, the slats individually track the motion of the sun, each adjusting its tilt angle to bring its normal axis into alignment with the direction of light. The slat assembly's tilt controller may perform this function autonomously, or may do so with input from the panel's controller. For example, the tilt controller might query the panel controller for its estimate of the current angular position of the sun, move the slat to match that angle, and then repeatedly measure the relative outputs of the receivers on the two facing sides of the slat and rotate the slat a small amount in the direction that moves the side with greater output closer to the sun.

Figure 27:
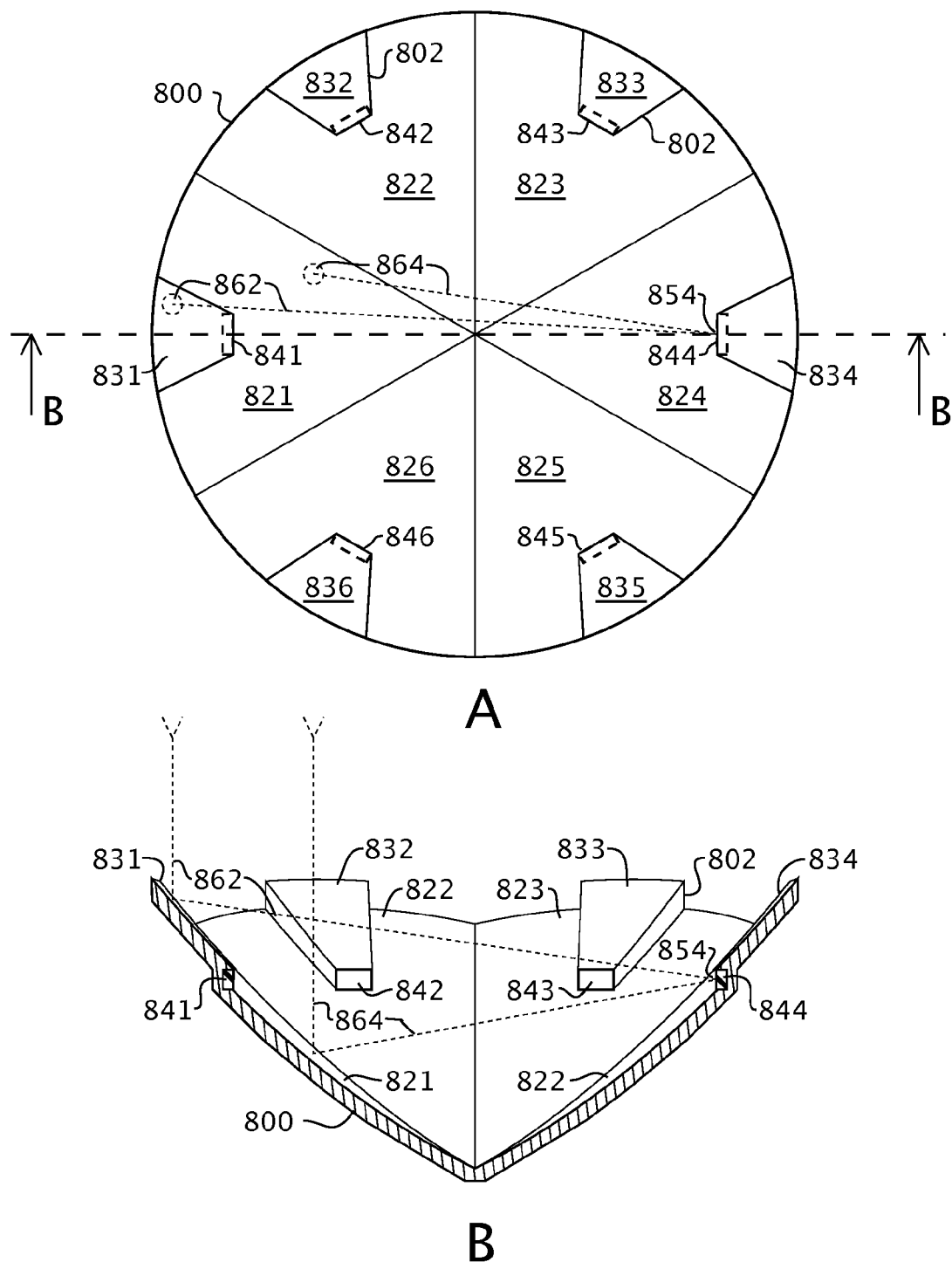
FIGS. 27 and 28: Two-Axis Reflector Examples
Figure 28:
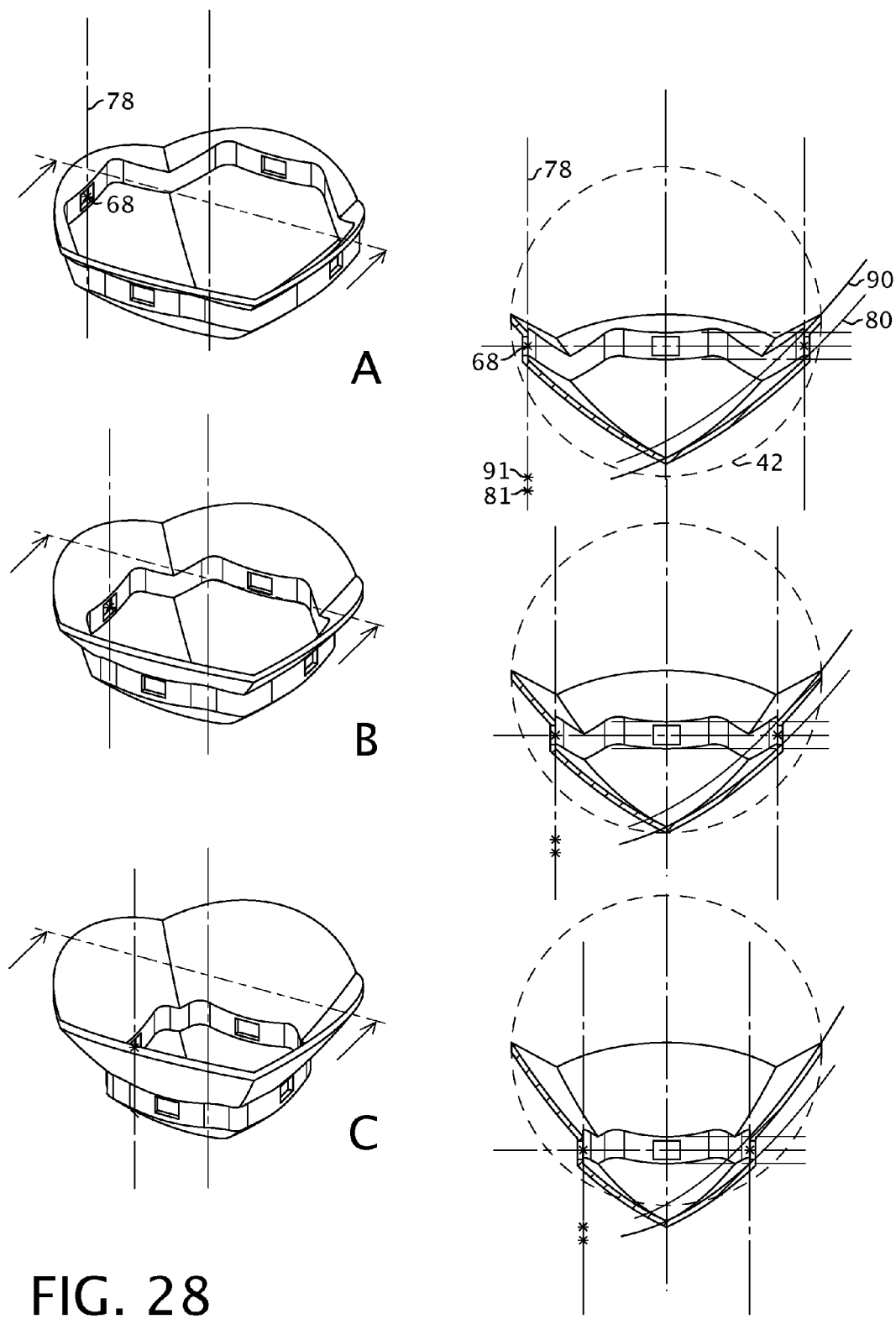

Two-Axis Reflector Examples: FIGS. 27 and 28

FIG. 27 shows an embodiment of the invention in which the reflector has six-fold rotational symmetry and a circular profile. FIG. 27A is a view from the direction of the reflector's optical axis, and FIG. 27B is a cross-section through a reflective plane of symmetry of the reflector that contains two of the reflector's six focal points.

The reflector 800 depicted in FIG. 27 has six identical sections, each occupying a 60-degree wedge and each having two paraboloid mirrors and a photovoltaic cell situated in a riser straddling the coincident focal points of the two paraboloid mirrors in the opposite section of the reflector. In FIG. 1, the six sections have, respectively, the large mirrored paraboloid faces 821, 822, 823, 824, 825, and 826; the small mirrored paraboloid faces 831, 832, 833, 834, 835, and 836; and the receivers 841, 842, 843, 844, 845, and 846.

Each receiver is embedded in a riser 802 intervening between a large paraboloid mirror and a small paraboloid mirror. Said receiver is embedded in the one of the three facets of the riser that faces the opposite section of the reflector, and straddles the common focal point of the two mirrors in that section. Thus, for example, cell 844 straddles focal point 854, and is situated so as to absorb reflected light from both the small mirror 831 and the large mirror 821 in the opposing section of the six-fold reflector.

The dotted lines 862 and 864 show how two rays of incident light, each approaching the reflector parallel its optical axis, are reflected. Light ray 862 is reflected by paraboloid face 831 to land on receiver 844, and light ray 864 is reflected by paraboloid face 821 to land on receiver 844.

FIG. 28 shows the effect of varying the design parameter that determines the positioning of focus-coincident risers between the reflector's vertex and its edges in a reflector embodiment having a circular profile as seen from the direction of its optical axis and fourfold rotational symmetry. This design parameter is the same one as that determining the placement of the riser described with reference to FIG. 5, in this case applied to a reflector with paraboloid mirrors. The figure shows three reflectors labeled A, B, and C, as two views of each: a trimetric view on the left and a cross-sectional view on the right. The dashed circle 42 superimposed on each cross-sectional view shows the approximate clearance profile required by the reflectors' edges as the reflector is pivoted about their centroid of the outermost points of the reflector's edge.

FIG. 28 also shows some of the geometric entities shown in FIG. 4 describing the generation of the reflector's shape. The cross-sectional views show the lower and upper parabolas 80 and 90 that generate the paraboloid surfaces. The axis 78, corresponding to the Y axis in FIG. 4A and containing the shared focus 68 and vertices 81 and 91 of the parabolas 80 and 90, is also the axis of revolution of the paraboloids generated by them.

As is the case with the one-axis reflectors examined in FIG. 5, the more desirable instances of the simple form of paraboloid reflectors shown in FIG. 28 position the risers at an intermediate distance between the upper edges and lower vertex of the reflector, with case B being preferable to cases A and C. Case B in FIG. 28 is advantageous for the same set of reasons that cases B and E in FIG. 5 are. Compared to case A, case B provides more space behind the focal points 68 for mounting electronics and heat management equipment associated with the receivers. Unlike case C, case B fits the reflector entirely within the spherical clearance profile indicated by the dashed circle 42, enabling it to be pivoted about the centroid of its upper edge in an unrestricted range of motion within a densely packed array. Compared to cases A and C, case B provides a smaller average incidence angle upon its receivers.

Four-Fold Reflector with Profile Suited to Close-Packed Arrays

Figure 29:
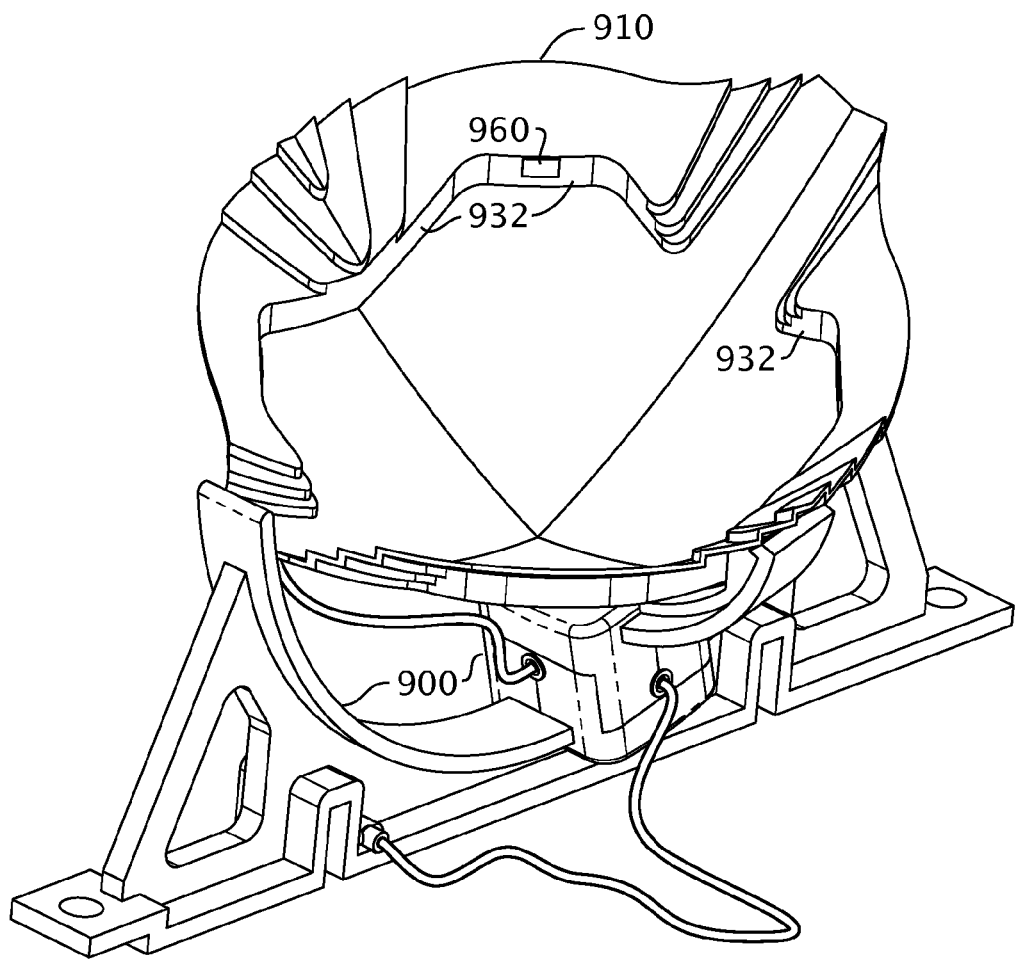

FIGS. 29 and 30 show an embodiment of the invention in which the reflector has two reflective symmetries and an operational clearance profile designed for use in close-packed arrays of reflectors, each such reflector is allowed to move independently. FIG. 29 shows the reflector and its associated support and angular positioning apparatus 900, where the latter effects movement of the reflector about two perpendicular pivoting axes which intersect at the centroid of the reflector's upper edge. FIG. 30 shows views and sections of the reflector, where FIG. 20A is an isometric view of the reflector, FIG. 30B is a view down its optical axis and FIGS. 30C through E are cross-sections indicated in FIG. 30B.

The reflector 910 has four sections which are identical to, or mirror images of, each other, each section occupying one of the four quadrants divided by the section lines C and E in FIG. 30B. Each quadrant has a set of paraboloid mirrors that share an optical axis and coincident focus 912 situated on a riser 932 on the opposite, facing side the reflector. Only the paraboloid mirrors and receiver in the upper-right quadrant as seen in FIG. 30B are labeled, and only portions of the riser in the lower-left quadrant are labeled. The two largest paraboloids 922 and 925 are separated by a span of the riser 932 that contains the receiver 960, and five other paraboloids separated by shallower spans of said riser. In order of decreasing scale and increasing height, the paraboloids are 922, 923, 924, 925, 926, 927, and 928. When viewed down the reflector's normal axis as in FIG. 30B, the paraboloid mirrors entirely cover the profile of the reflector, where the riser 932 separating the mirrors, being parallel to said axis, appears as a set of lines and arcs.

The bounding shapes of the paraboloid faces and the paraboloid scale-factors defining their three-dimensional shapes are selected to fulfill a variety of objectives including: providing risers in positions and with dimensions suitable for mounting receivers; providing unobstructed paths for light from the paraboloid faces to the receivers; and fitting the entire reflector within a desired clearance profile.

The shape of the reflector shown in FIGS. 29 and 30 was designed to fit in the clearance profile required by modules using the two-axis angular positioning means described in U.S. provisional patent filing 61/200,835. That document describes a one-parameter family of flat shapes each of which, when mounted for two-axis rotation using said angular positioning means, traces out a three-dimensional shape whose projection onto the X-Y plane remains entirely within the original flat shape. Shallow dish-type reflectors whose X-Y profile closely approximates such a shape, and whose rim deviates only slightly from the plane parallel to the X-Y plane containing the angular positioner's rotation centroid, can be packed into dense arrays such that neighboring reflectors cannot collide no matter how they move on their respective mounts.

Figure 31:
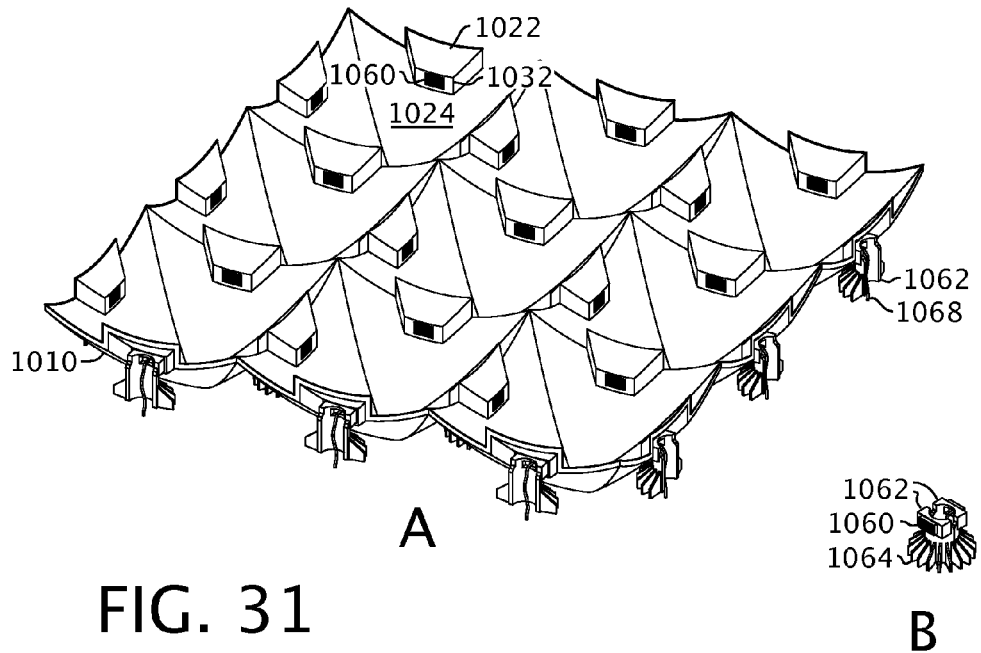
FIGS. 31 and 32: Fixed-Geometry Arrays
Figure 32:
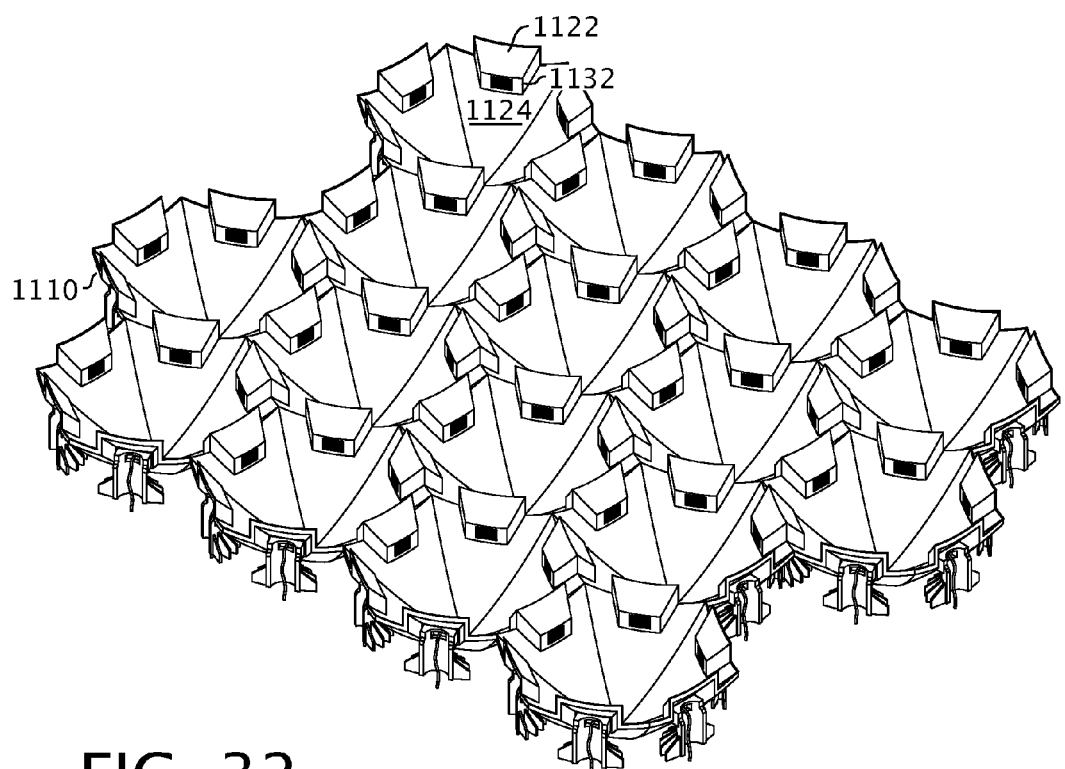

Fixed-Geometry Arrays: FIGS. 31 and 32

FIGS. 31 and 32 show embodiments of the invention in which the reflector is composed of an array of identical cells in fixed relationship to one-another, where each cell has the essential features of the invention's optical geometry. FIG. 31A shows a trimetric view of a reflector consisting of nine cells, each of which has eight paraboloid mirrors and four receivers in a configuration having fourfold rotational symmetry and four planes of reflective symmetry, and FIG. 31B shows a receiver assembly pair removed from the array. FIG. 32 shows an isometric view of a reflector consisting of sixteen cells, each of which has twelve paraboloid mirrors and six receivers in a configuration having sixfold rotational symmetry and six planes of reflective symmetry. In each of the figures only one representative mirror of the respective embodiment's two types of mirrors is labeled.

In the embodiment shown in FIG. 31, the reflector body 1010 spans the fixed array of nine cells. Each of the four sections of each cell has two paraboloid mirrors, the upper mirror 1022 and the lower mirror 1024 separated by the riser 1032, where said riser is perforated by a rectangular hole filled by the photovoltaic cell 1060 of a receiver assembly. Portions of several such receiver assemblies 1062 are visible on the facing sides of the array, and a pair of two such assemblies, such are found in the interior of the array, is shown in FIG. 31B. A cylindrical cavity in the body of the receiver assembly allows passage of the wires 1068 from the photovoltaic cells, and the fins 1064 on said body facilitate dissipation of heat.

In the embodiment shown in FIG. 32, the reflector body 1110 spans the fixed array of sixteen cells. Each of the six sections of each cell has two paraboloid mirrors, the upper mirror 1122 and the lower mirror 1124 separated by the riser 1132, where said riser is perforated by a rectangular hole filled by the photovoltaic cell of a receiver assembly like that described with reference to FIG. 31. This embodiment has the advantage over the previous one that the average angle of incidence of light on the receivers is less, whereas the previous embodiment has the advantage that the reflector exactly covers a rectangular region and can therefore fill the aperture of a rectangular enclosure.

Figure 33:
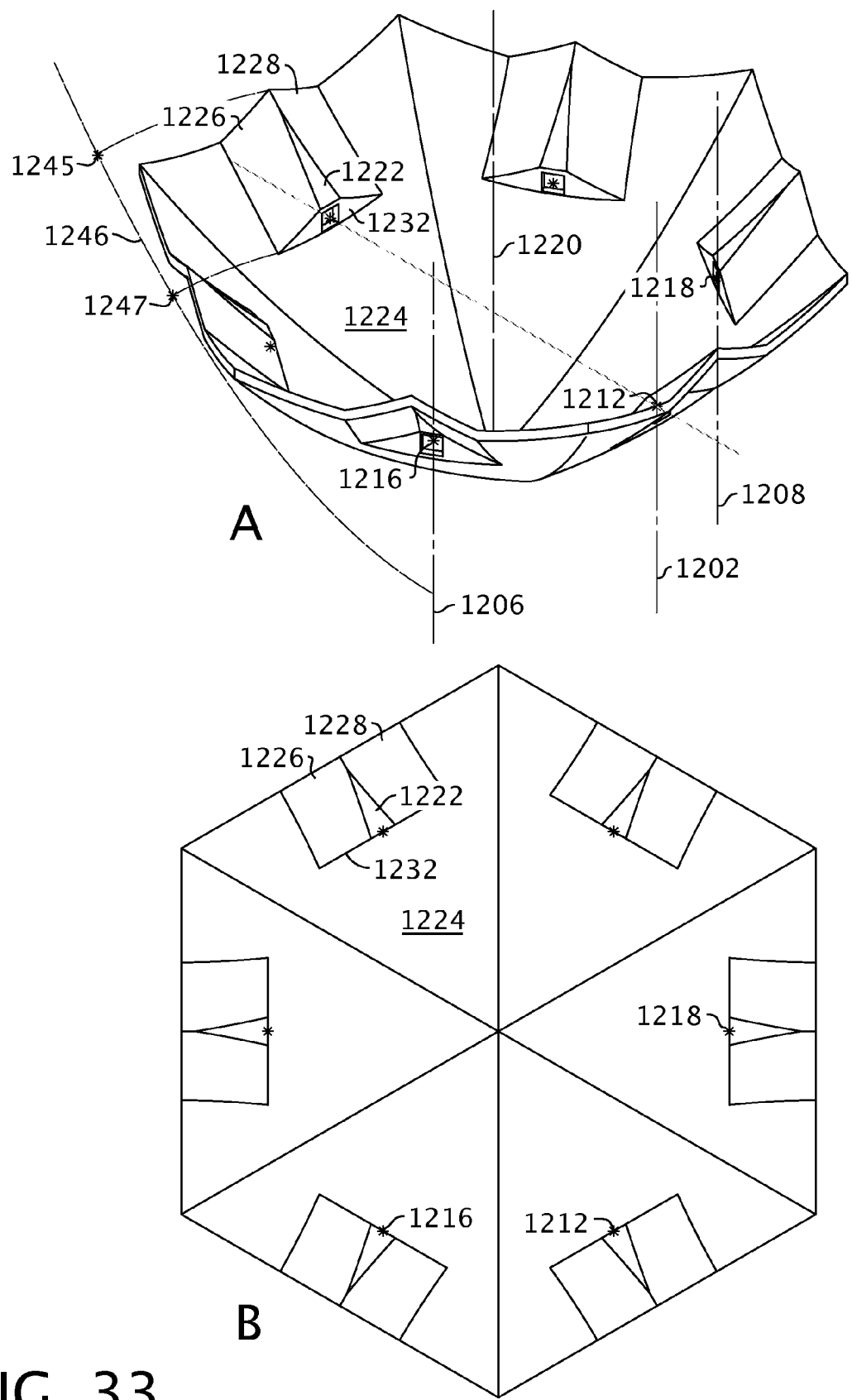
FIG. 33: Reflector Having Reduced Surface Area

Reflector Having Reduced Surface Area: FIG. 33

FIG. 33 shows the reflector of an embodiment of the invention in which the extent of vertical risers has been reduced by replacing with paraboloid mirrors those riser faces not having receivers. FIG. 33A shows an isometric view of the reflector, and FIG. 33B shows a view down the reflector's normal axis. The reflector has six-fold rotational symmetry about the axis 1220 in which each of six identical sections has a plane of reflective symmetry. In FIG. 33, the mirrors and riser of only one such section are labeled.

Like embodiments described above, the reflector has a larger paraboloid mirror 1224 below the riser 1232 and a smaller paraboloid mirror 1222 above said riser, where both mirrors share the focal point 1212 situated in the riser of the opposite section of the reflector. Unlike above-described embodiments, the present reflector has the paraboloid mirrors 1226 and 1228, which have the focal points 1216 and 1218, respectively, said focal points being in the reflector sections to either side of the section immediately opposite the section having those mirrors. Thus, whereas the paraboloid mirrors 1222 and 1224 share the axis of revolution 1202, the paraboloid mirrors 1226 and 1228 have the axes of revolution 1206 and 1208, respectively.

FIG. 33A also shows the parabola 1246 whose rotation about the axis 1206 generates the paraboloid to which the mirror 1226 belongs, where the points 1245 and 1247 bound the portion of said parabola that sweeps out the smallest portion of the paraboloid covering the said mirror. FIG. 33B also shows the paths of representative light rays reflected by each of the labeled mirrors as dashed lines.

Compared to similar previously described embodiments, the reflector shown in FIG. 33 requires has less surface area and therefore requires less material, and has fewer risers and therefore fewer sharp dihedral angles between risers and mirrors. As a result this embodiment potentially affords greater economy of material and ease of manufacture. It does so at the expense of slightly higher average angles of incidence on the receivers due to the angular relationship between the mirrors 1226 and 1228 and the receivers to which they direct light.

Persons skilled in the art will be able to foresee many modifications to the described embodiments. For example, the reflector shown in FIG. 33 could be modified to have eightfold rotational symmetry, and the mirrors flanking the risers 1232 in each of the reflector's eight sections could have focal points situated in the second instead of the first sections to either side of the directly opposite section. The upper paraboloid mirrors 1222 could be eliminated. The reflector could be further simplified by eliminating all but the largest paraboloid mirrors 1224, with receivers protruding above those mirrors, but such a modification would reduce the reflector's aperture efficiency.

Conclusion, Ramifications, and Scope of the Invention

While the above description contains many specifics, these should not be construed as limitations on the scope of the invention, but rather as exemplifications of several embodiments thereof. Many other variations are possible. Accordingly, the scope of the invention should be determined not by the embodiments illustrated but by the appended claims and their legal equivalents.

What is claimed is:

1. A device for collecting energy from a light source comprising:
a reflector for focusing incident light, the reflector comprising a plurality of reflective surfaces,
wherein each reflective surface has the shape of a portion of a paraboloid of revolution, and some of the plurality of reflective surfaces form an aperture, and each reflective surface has a focal point that coincides with one of a plurality of focal points located proximal to a surface of the reflector, and each reflective surface has an optical axis that is parallel to and offset from an axis of symmetry of the reflector.

2. The device of claim 1, comprising a plurality of receivers, wherein each receiver is proximal to the focal point of at least one of the reflective surfaces.

3. The device of claim 2, wherein the reflector comprises a plurality of risers, wherein each riser is connected to a first reflective surface and to a second reflective surface, of the plurality of reflective surfaces, the first reflective surface lying closer to and the second reflective surface lying farther from the aperture, and the plurality of focal points are located proximal to the riser.

4. The device of claim 3, wherein a riser comprises an opening proximal to the focal point of at least one of the reflective surfaces, and a receiver is mounted proximal to the opening.

5. The device of claim 4, wherein the first reflective surface conceals the receiver mounted proximal to the opening, as viewed from the aperture along the axis of symmetry of the reflector.

6. The device of claim 2, comprising a heat transfer element coupled to at least one receiver.

7. The device of claim 2, wherein at least one receiver is selected from an image sensor and a photovoltaic cell.

8. The device of claim 1, wherein the reflector has symmetry selected from four-fold rotational symmetry and four-fold reflective symmetry, and six-fold rotational symmetry and six-fold reflective symmetry.

9. The device of claim 1, wherein the reflector is dimensioned to be rotated through 360 degrees in any direction within a sphere having the diameter of the aperture.

10. The device of claim 1, wherein the diameter of the aperture is about twice the depth of the reflector.

11. A system for collecting energy from a light source, the system comprising:
an array of devices, wherein each device comprises a reflector for focusing light, each reflector comprising,
a plurality of reflective surfaces, wherein each reflective surface has the shape of a portion of a paraboloid of revolution, and some of the plurality of reflective surfaces form an aperture, and each reflective surface has a focal point that coincides with one of a plurality of focal points located proximal to a surface of the reflector, and each reflective surface has an optical axis that is parallel to and offset from an axis of symmetry of the reflector.

12. A device for collecting energy from a light source comprising:
a reflector for focusing incident light, the reflector comprising,
a plurality of reflective surfaces, wherein each reflective surface has the shape of a portion of a paraboloid of revolution, and some of the plurality of reflective surfaces form an aperture, and each reflective surface has a focal arc that coincides with one of a plurality of focal arcs located proximal to a surface of the reflector, and each reflective surface has an optical axis that is parallel to and offset from an axis of symmetry of the reflector.

13. The device of claim 12, comprising at least one receiver, wherein the at least one receiver is proximal to the focal arc of at least one of the reflective surfaces.

14. The device of claim 13, wherein the reflector comprises at least one riser, wherein the riser is connected to a first reflective surface and to a second reflective surface, of the plurality of reflective surfaces, the first reflective surface lying closer and the second reflective surface lying farther from the aperture, and at least one focal arc is located proximal to the riser.

15. The device of claim 14, wherein a riser comprises an opening proximal to the focal arc of at least one of the reflective surfaces, and the receiver is mounted proximal to the opening.

16. The device of claim 15, wherein the first reflective surface conceals the receiver mounted proximal to the opening, as viewed from the aperture along the axis of symmetry of the reflector.

17. The device of claim 13, comprising a heat transfer element coupled to at least one receiver.

18. The device of claim 13, wherein at least one receiver is selected from an image sensor and a photovoltaic cell.

19. The device of claim 12, wherein the reflector is dimensioned to be rotated through 360 degrees in any direction within a sphere having the diameter of the aperture.

20. The device of claim 12, wherein the diameter of the aperture is about twice the depth of the reflector.

* * * * *